United States Patent
Sedlmaier et al.

(10) Patent No.: US 9,941,365 B2
(45) Date of Patent: Apr. 10, 2018

(54) METHOD FOR FORMING A STRESS-REDUCED FIELD-EFFECT SEMICONDUCTOR DEVICE

(71) Applicant: Infineon Technologies Austria AG, Villach (AT)

(72) Inventors: Stefan Sedlmaier, Munich (DE); Markus Zundel, Egmating (DE); Franz Hirler, Isen (DE); Johannes Baumgartl, Riegersdorf (AT); Anton Mauder, Kolbermoor (DE); Ralf Siemieniec, Villach (AT); Oliver Blank, Villach (AT); Michael Hutzler, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/189,152

(22) Filed: Jun. 22, 2016

(65) Prior Publication Data

US 2016/0300914 A1 Oct. 13, 2016

Related U.S. Application Data

(63) Continuation of application No. 14/531,202, filed on Nov. 3, 2014, now Pat. No. 9,406,763, which is a (Continued)

(51) Int. Cl.
*H01L 29/78* (2006.01)
*H01L 29/40* (2006.01)
(Continued)

(52) U.S. Cl.
CPC .......... *H01L 29/407* (2013.01); *H01L 21/765* (2013.01); *H01L 29/0653* (2013.01);
(Continued)

(58) Field of Classification Search
CPC .................................................. H01L 29/7846
See application file for complete search history.

(56) References Cited

U.S. PATENT DOCUMENTS

| 4,223,327 A | 9/1980 | Nara et al. |
|---|---|---|
| 6,111,290 A | 8/2000 | Uenishi et al. |

(Continued)

FOREIGN PATENT DOCUMENTS

| CN | 1599959 A | 3/2005 |
|---|---|---|
| CN | 1806337 A | 7/2006 |

(Continued)

*Primary Examiner* — Peniel M Gumedzoe
*Assistant Examiner* — Christopher Johnson
(74) *Attorney, Agent, or Firm* — Murphy, Bilak & Homiller, PLLC

(57) ABSTRACT

A method for producing a field-effect semiconductor device includes providing a semiconductor body with a first surface defining a vertical direction, defining an active area, forming a vertical trench from the first surface into the semiconductor body, forming a field dielectric layer at least on a side wall and a bottom wall of the vertical trench, depositing a conductive layer on the field dielectric layer, forming a closed cavity on the conductive layer in the vertical trench, and forming an insulated gate electrode on the closed cavity in the vertical trench.

16 Claims, 20 Drawing Sheets

Related U.S. Application Data continuation of application No. 13/429,525, filed on Mar. 26, 2012, now Pat. No. 8,907,408.

(51) Int. Cl.
| | |
|---|---|
| *H01L 21/765* | (2006.01) |
| *H01L 29/51* | (2006.01) |
| *H01L 29/66* | (2006.01) |
| *H01L 29/06* | (2006.01) |
| *H01L 29/739* | (2006.01) |
| *H01L 29/417* | (2006.01) |
| *H01L 29/423* | (2006.01) |

(52) U.S. Cl.
CPC .......... *H01L 29/401* (2013.01); *H01L 29/515* (2013.01); *H01L 29/66734* (2013.01); *H01L 29/7397* (2013.01); *H01L 29/7804* (2013.01); *H01L 29/7811* (2013.01); *H01L 29/7813* (2013.01); *H01L 29/7843* (2013.01); *H01L 29/41766* (2013.01); *H01L 29/42368* (2013.01)

(56) References Cited

U.S. PATENT DOCUMENTS

| | | |
|---|---|---|
| 7,300,854 B2 | 11/2007 | Benzel et al. |
| 8,907,408 B2 | 12/2014 | Sedlmaier et al. |
| 2007/0126056 A1 | 6/2007 | Hirler |
| 2008/0150020 A1* | 6/2008 | Challa ................. H01L 21/3065 257/331 |
| 2009/0273026 A1 | 11/2009 | Wilson et al. |
| 2010/0044785 A1 | 2/2010 | Murphy et al. |
| 2011/0101416 A1 | 5/2011 | Schulze et al. |
| 2011/0136310 A1 | 6/2011 | Grivna |
| 2012/0313161 A1* | 12/2012 | Grivna ................. H01L 29/7842 257/330 |

FOREIGN PATENT DOCUMENTS

| | | |
|---|---|---|
| DE | 102006007729 A1 | 8/2007 |
| WO | 03050879 A1 | 6/2003 |

\* cited by examiner

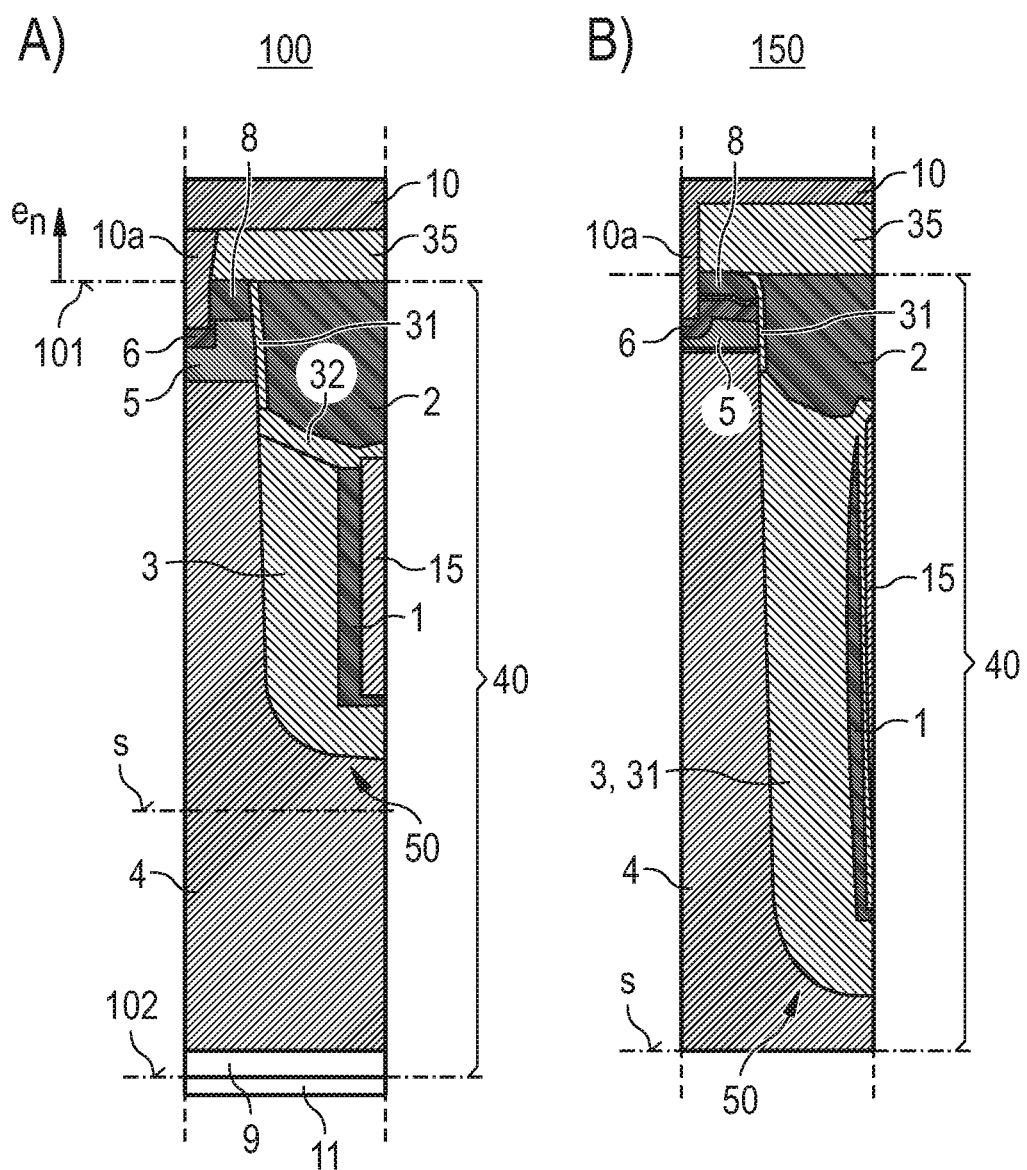

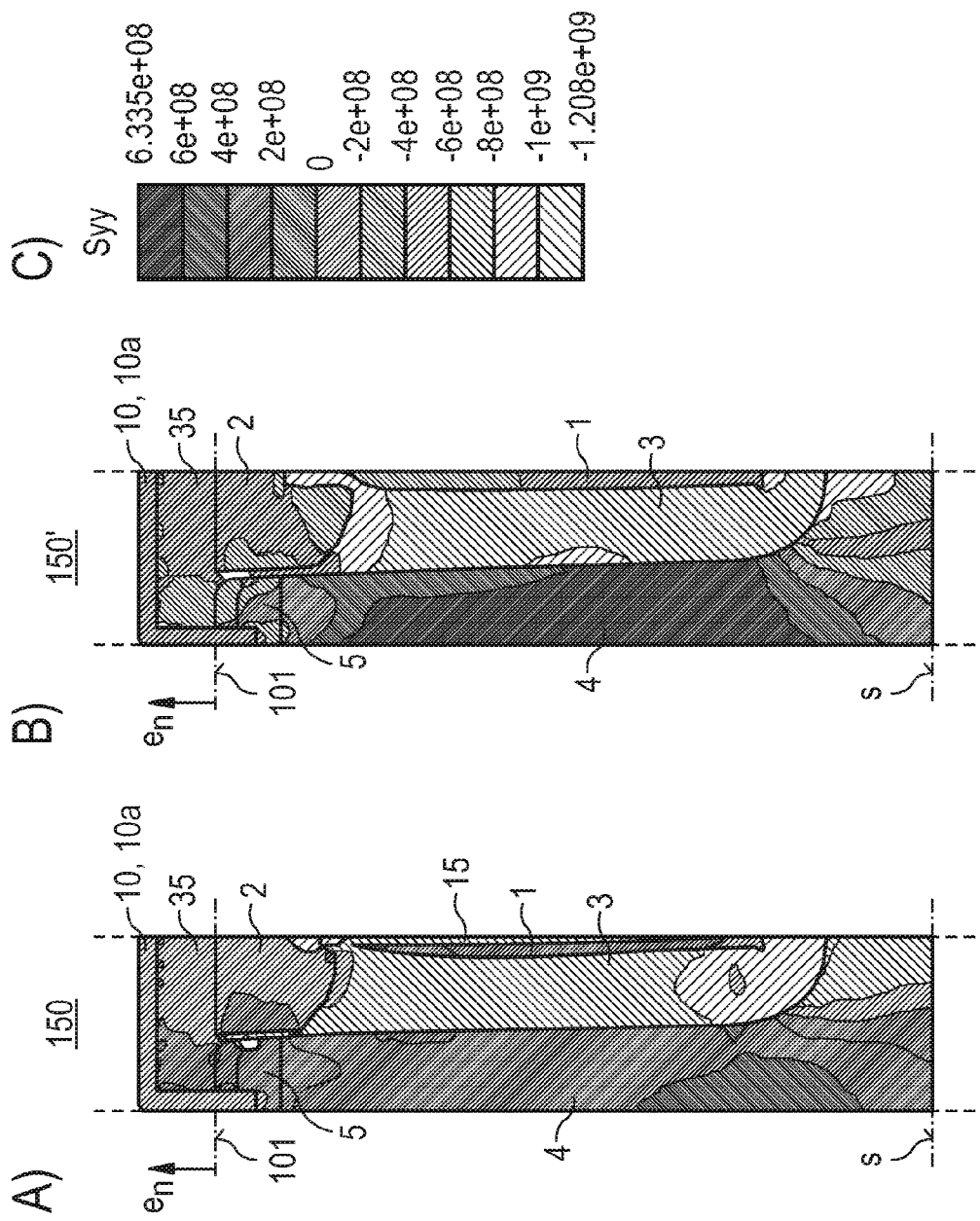

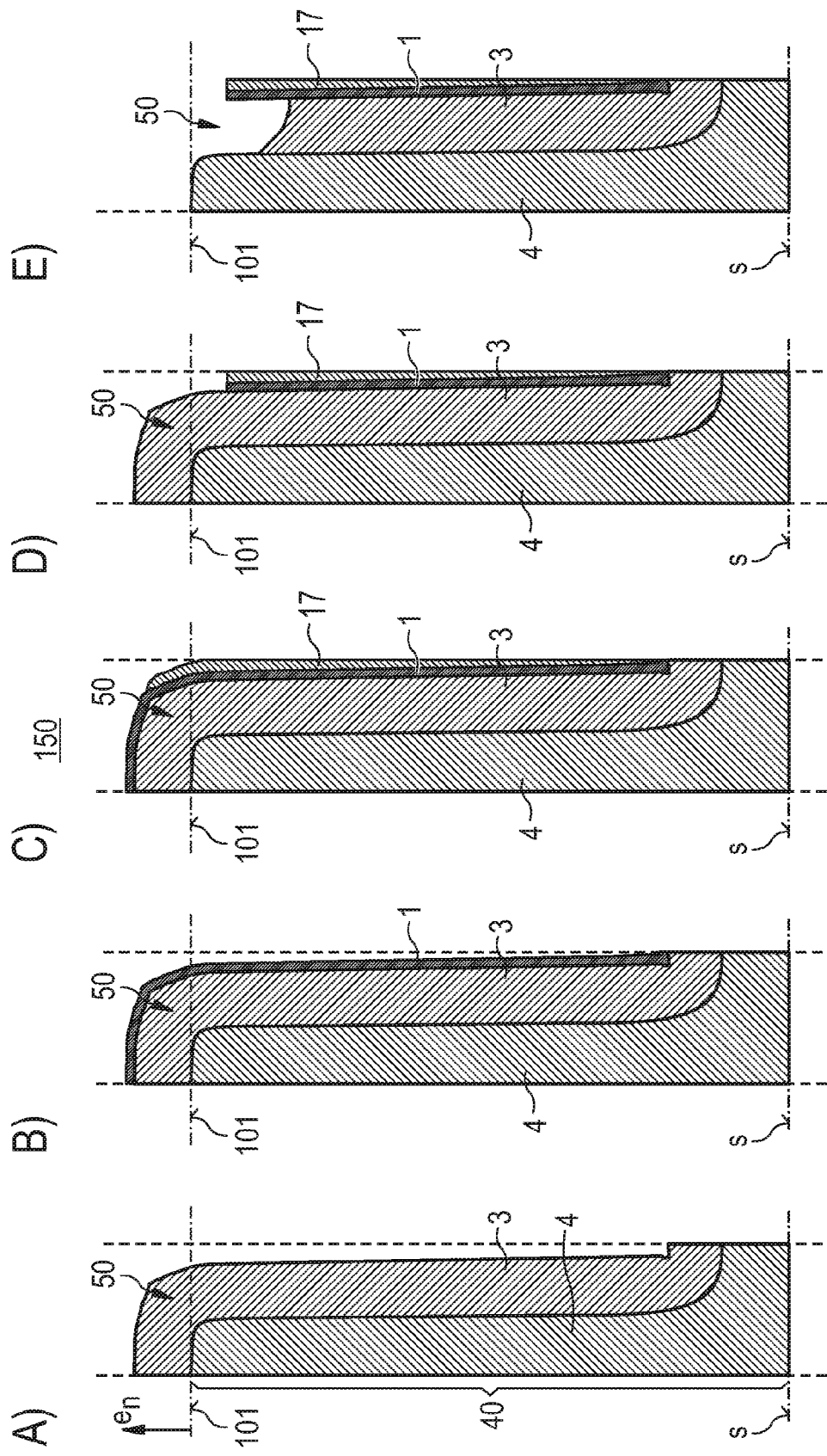

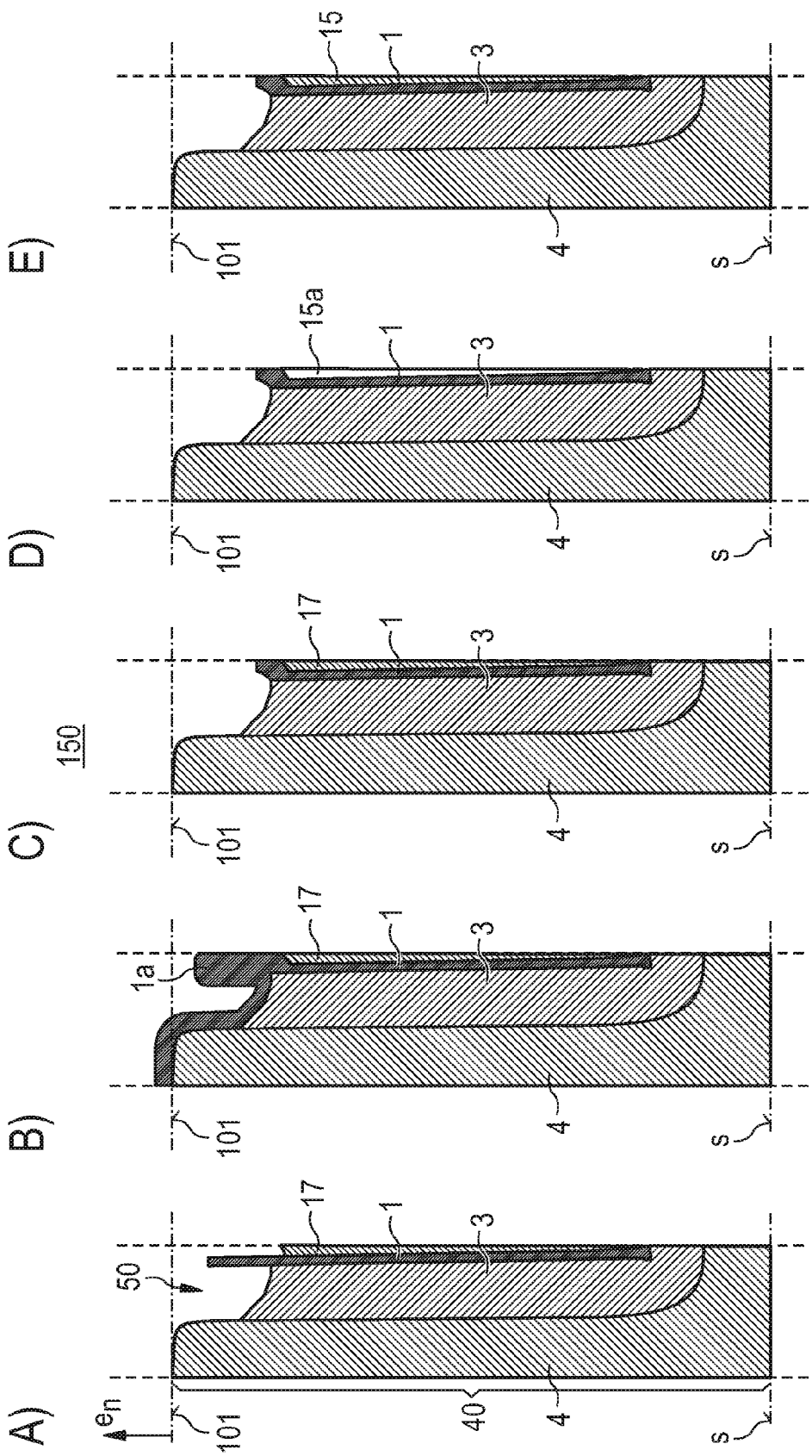

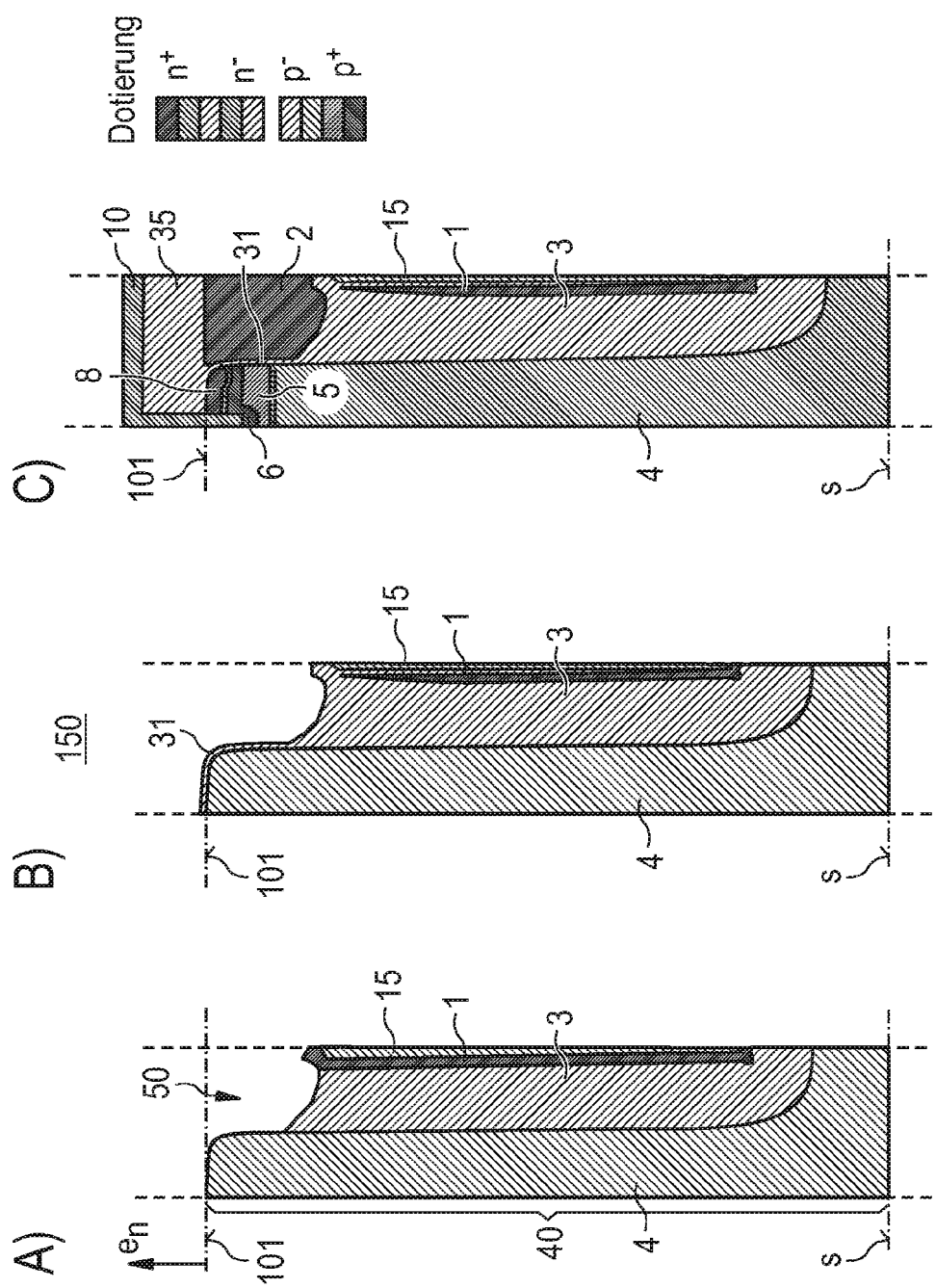

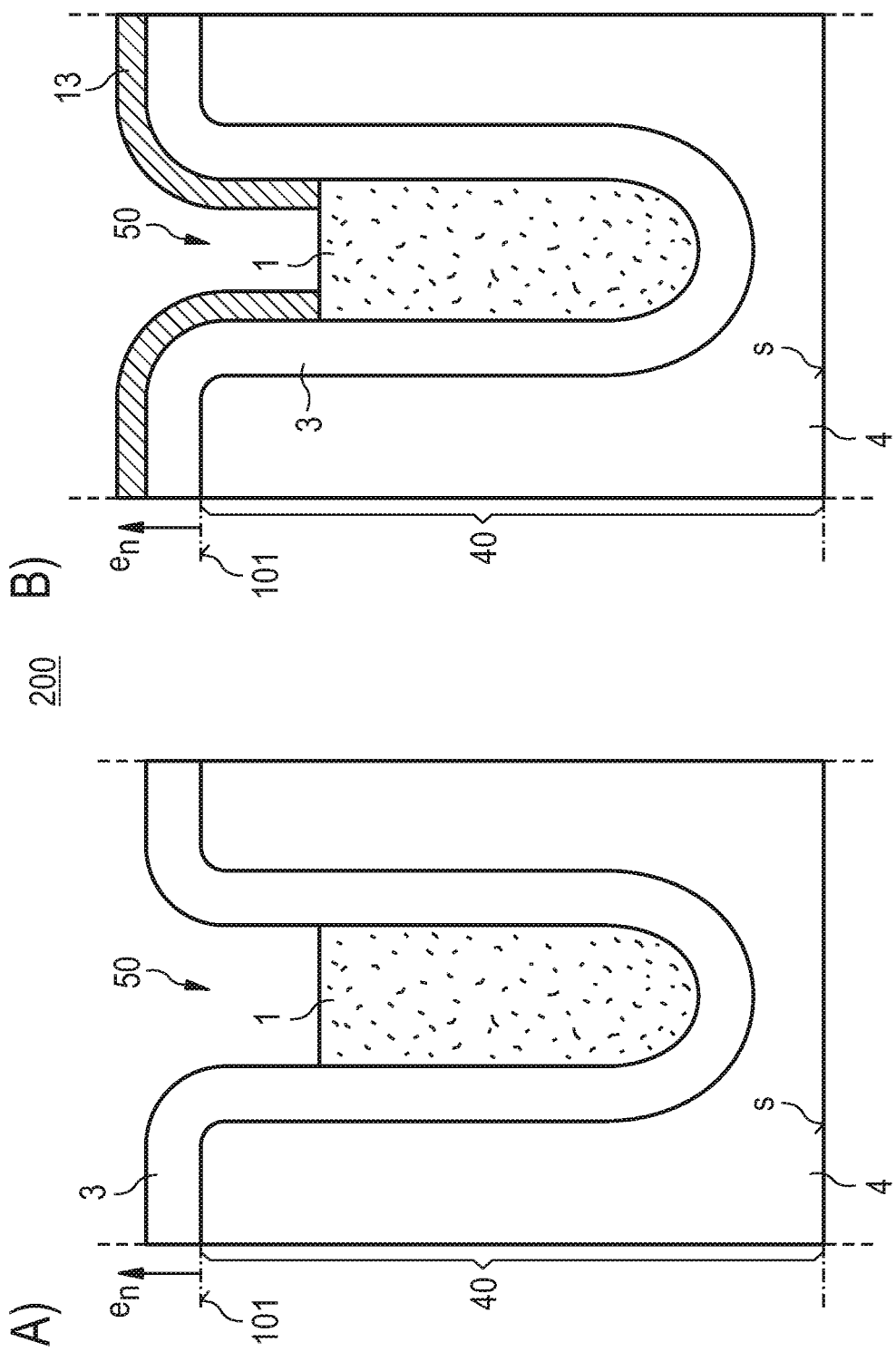

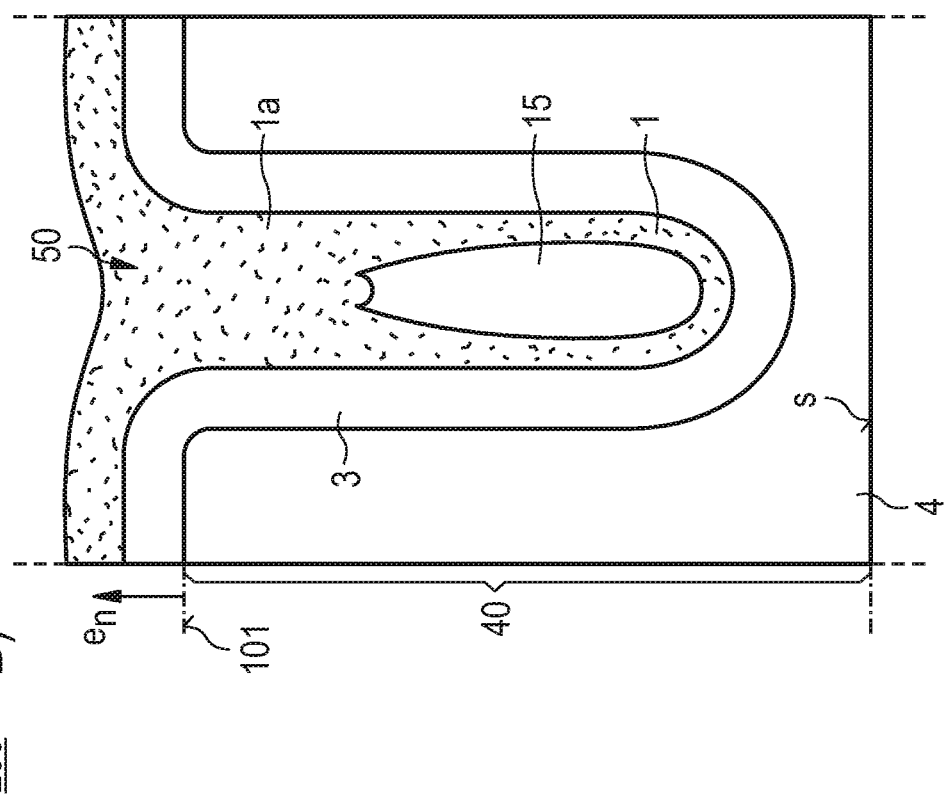
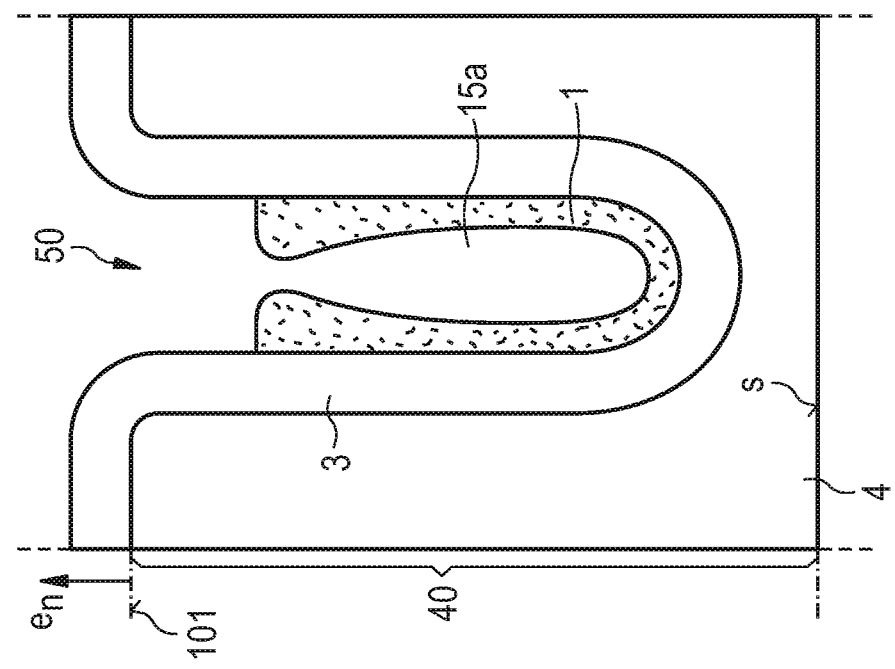

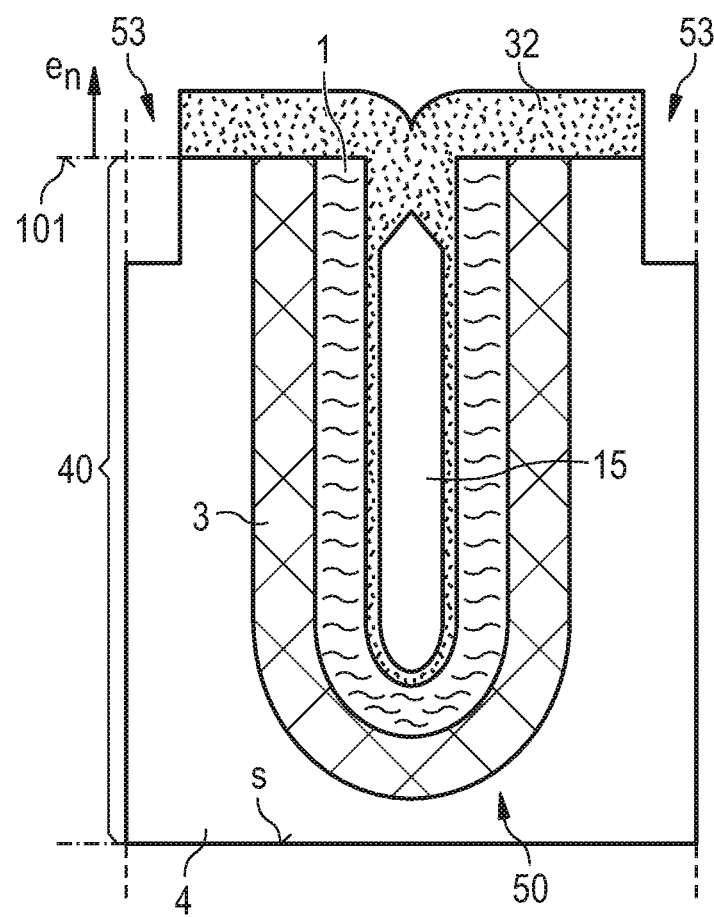

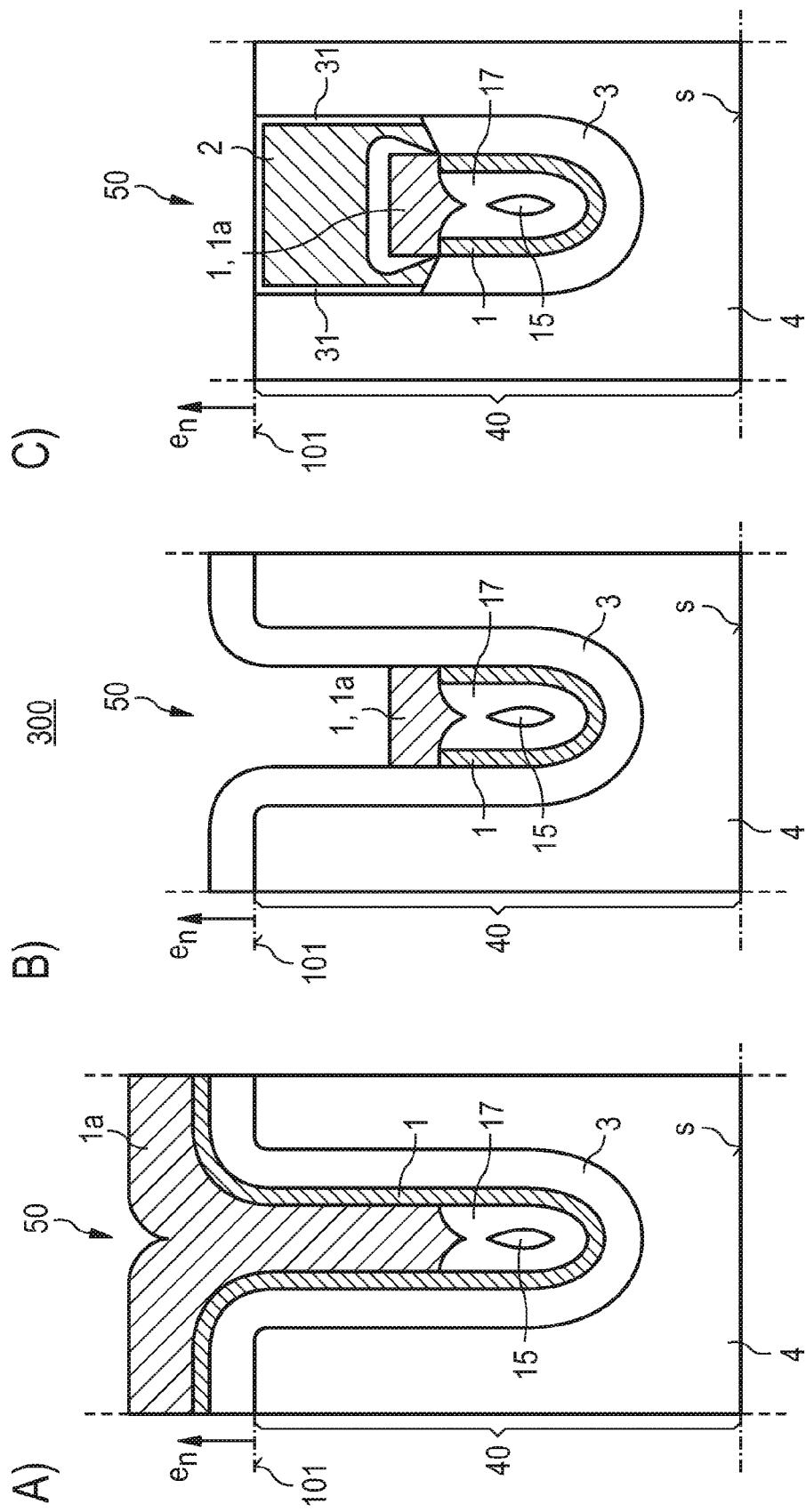

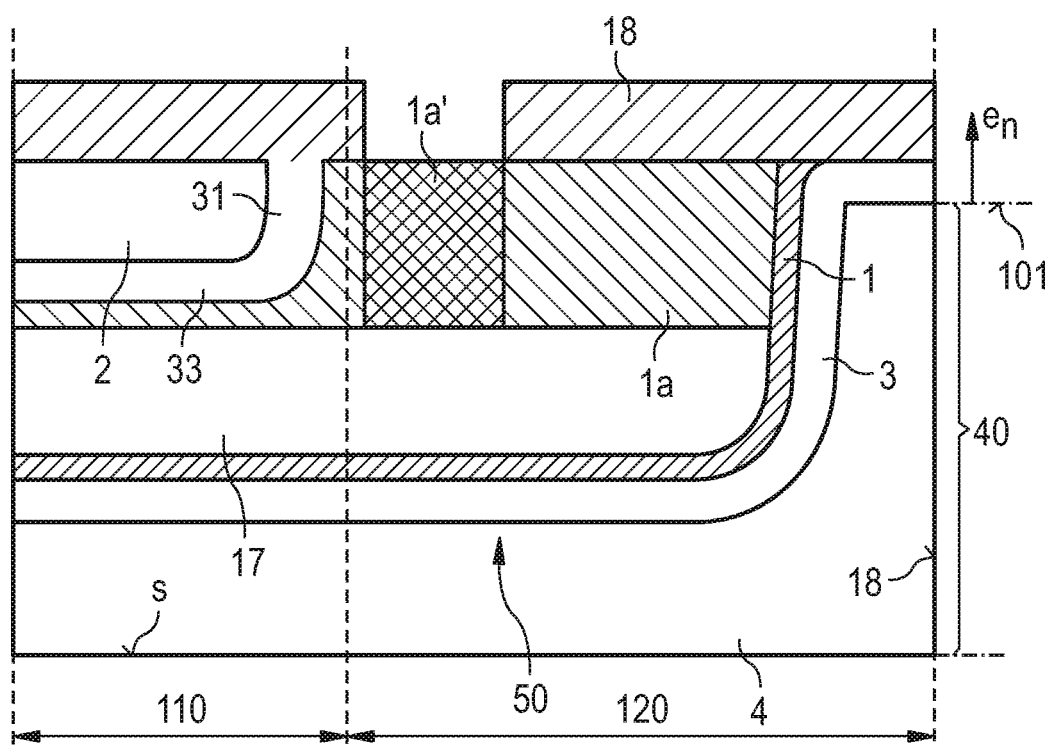

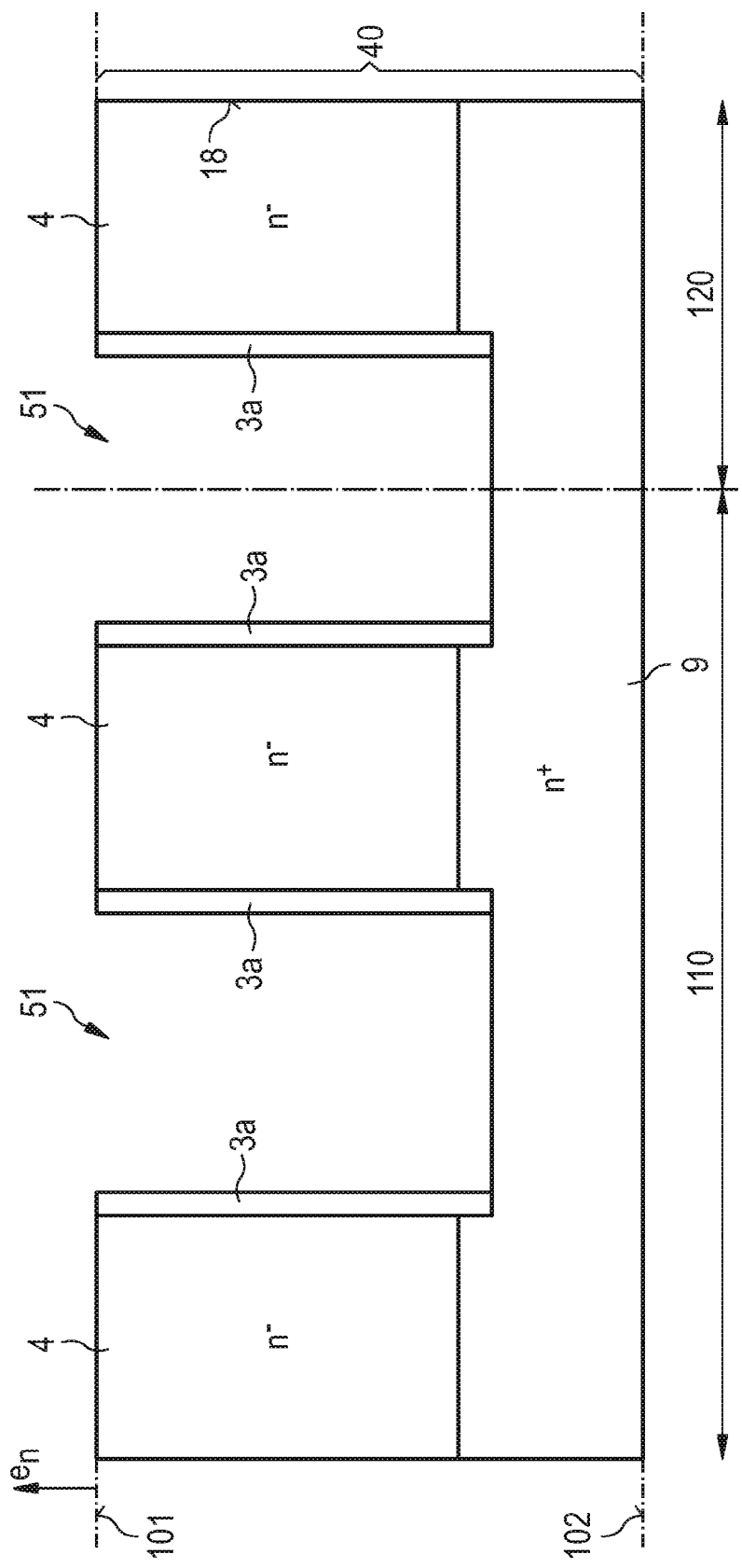

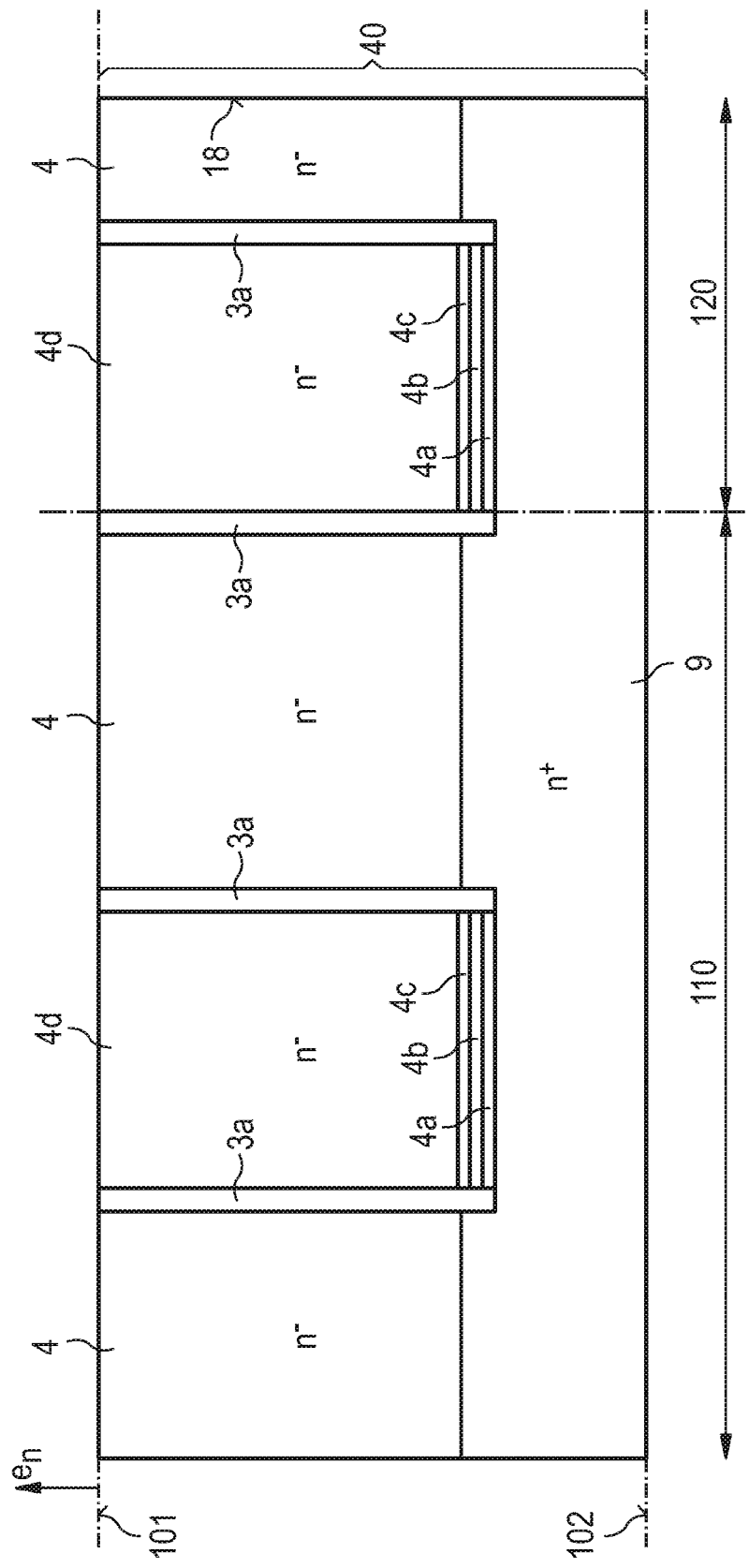

US 9,941,365 B2

METHOD FOR FORMING A STRESS-REDUCED FIELD-EFFECT SEMICONDUCTOR DEVICE

PRIORITY CLAIM

This application is a continuation of U.S. patent application Ser. No. 14/531,202 filed on 3 Nov. 2014, which in turn is a continuation of U.S. patent application Ser. No. 13/429,525 filed on 26 Mar. 2012 (now U.S. Pat. No. 8,907,408), the content of both of said applications incorporated herein by reference in their entirety.

TECHNICAL FIELD

Embodiments of the present invention relate to field-effect semiconductor devices having a semiconductor body and dielectric regions extending into the semiconductor body, in particular to power field-effect semiconductor devices having dielectric regions extending into the semiconductor body, and to related methods for producing such field-effect semiconductor devices.

BACKGROUND

Semiconductor transistors, in particular field-effect controlled switching devices such as a Metal Oxide Semiconductor Field-effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low on-state resistance, which is in the following also referred to as on-resistance $R_{on}$, and high voltage blocking capability are often desired. Due to structural efficiency and low on-resistance $R_{on}$, vertical trench MOSFETs are widely used, in particular in power applications. The breakdown voltage of trench MOSFETs may be raised by optimizing the shape and depth of the trench and in particular by arranging an insulated field electrode in the vertical trench below the insulated gate electrode of the trench MOSFET. The field electrode is typically connected to source potential and insulated from drain potential by a field oxide. Accordingly, charges in the drift region between two neighboring vertical trenches are at least partially compensated and thus the blocking capability improved. Typically, the blocking capability of such a MOSFET increases with the vertical extension of the trench and the thickness of the field oxide. However, internal mechanical stress resulting from tensions at the corresponding semiconductor-insulator interfaces typically also increases with the vertical extension of the trench and the field oxide thickness, respectively. This may result in a bowing of the semiconductor substrate of the MOSFET, in particular during manufacturing on wafer level.

Another configuration of a vertical trench MOSFET is the so-called TEDFET (Trench Extended Drain Field-Effect Transistor) which allows for an improved decoupling of voltage blocking capability and on-resistance $R_{on}$ compared to conventional MOSFETs by controlling the conductivity in the drift region by a drift control region which is separated from the drift region by an accumulation dielectric vertically extending along the drift region. Power TEDFETS of higher blocking capability utilize an accumulation dielectric that extends deeply into the semiconductor material and may result in mechanical stress levels that may have an impact on manufacturing.

To reduce wafer bowing during device manufacturing, the thickness of the wafer may be increased, for example by providing an additional epitaxial layer below the vertical trench. However, this increases costs and may increase on-resistance $R_{on}$. Alternatively, or in addition, pre-stressed layers may be applied on the back-side of the wafer during device manufacturing. However, this also increases costs. Furthermore, different compressive and tensile layers may be required during different process steps to compensate the bowing. Even further, compensating the wafer bowing typically increases mechanical stress in the wafer. Accordingly, risk of forming crystal defects during epitaxial processes increases. This may even have an impact on the device performance.

Accordingly, there is a need to provide mechanical stress reduced vertical MOSFETs and related manufacturing methods.

SUMMARY

According to an embodiment of a field-effect semiconductor device, the field-effect semiconductor device includes a semiconductor body with a first surface defining a vertical direction. In a vertical cross-section the field-effect semiconductor device further includes a vertical trench extending from the first surface into the semiconductor body and comprising a field electrode, a cavity at least partly surrounded by the field electrode, and an insulation structure substantially surrounding at least the field electrode. An interface between the insulation structure and the surrounding semiconductor body is under tensile stress and the cavity is filled or unfilled so as to counteract the tensile stress.

According to an embodiment of a field-effect semiconductor device, the field-effect semiconductor device includes a semiconductor body including a first surface defining a vertical direction, a substantially vertically orientated outer edge, and an active area which is spaced apart from the outer edge and includes a plurality of insulated gate electrodes arranged next to the first surface and extending into the semiconductor body, and a plurality of dielectric regions spaced apart form the insulated gate electrodes and extending from the first surface into the semiconductor body and vertically below the insulated gate electrodes. The field-effect semiconductor device further includes at least one of a cavity arranged below the first surface and between the outer edge and the active area, a cavity arranged below the first surface and in a kerf region, a cavity arranged next to a lowermost portion of at least one of the plurality of dielectric regions, and a cavity comprising, in a vertical cross-section, a maximum horizontal extension and a maximum vertical extension larger than the maximum horizontal extension. An interface between the dielectric regions and the surrounding semiconductor body is under tensile stress and the cavity is filled or unfilled so as to counteract the tensile stress.

According to an embodiment of a field-effect semiconductor device, the field-effect semiconductor device includes a semiconductor body including a first surface defining a vertical direction, a trench gate electrode which extends from the first surface into the semiconductor body and is insulated from the semiconductor body by a gate dielectric region, and a cavity arranged, in the vertical direction, at least partially below the trench gate electrode and is configured to reduce a mechanical stress in the semiconductor body. The cavity is unfilled.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1, which includes FIGS. 1A and 1B, illustrates vertical cross-sections through a field-effect semiconductor device according to embodiments;

FIG. 2, which includes FIGS. 2A to 2C, illustrates a mechanical stress corresponding to the field-effect semiconductor device of FIG. 1B;

FIG. 3, which includes FIGS. 3A to 3E, FIG. 4, which includes FIGS. 4A to 4E, and FIG. 5, which includes FIGS. 5A to 5C, illustrate vertical cross-sections through a semiconductor body during method steps of a method according to embodiments;

FIG. 6, which includes FIGS. 6A to 6B, and FIG. 7, which includes FIG. 7A and FIG. 7B, illustrate vertical cross-sections through a semiconductor body during method steps of a method according to embodiments;

FIG. 8 illustrates a vertical cross-section through a semiconductor body during a method step of a method according to embodiments;

FIG. 9, which includes FIGS. 9A to 9C, and FIG. 10 illustrate vertical cross-sections through a semiconductor body during method steps of a method according to embodiments;

FIGS. 11 to 16 illustrate vertical cross-sections through a semiconductor body during method steps of a method according to embodiments;

DETAILED DESCRIPTION

Figure 13:
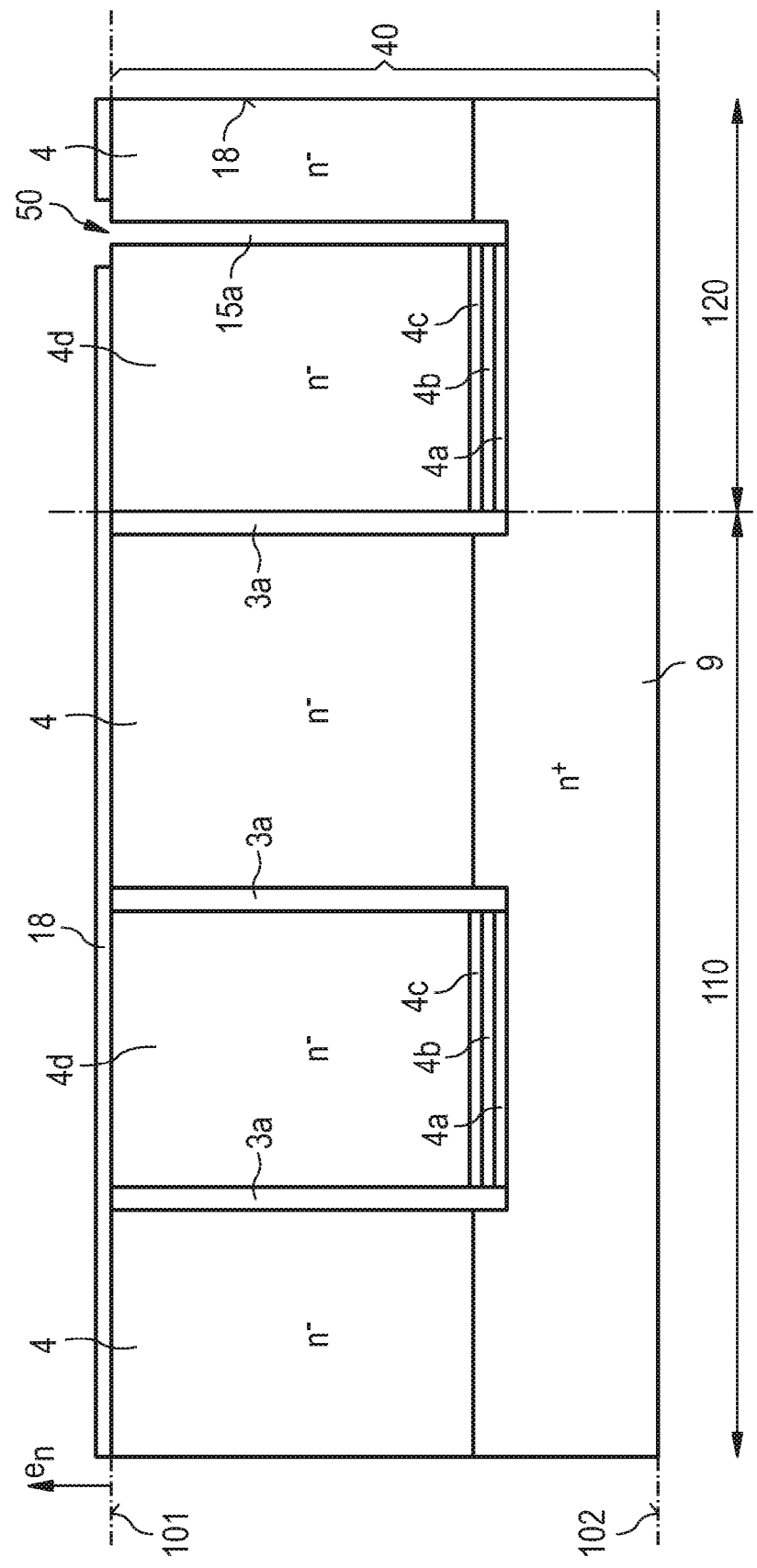

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to semiconductor devices, in particular to field effect semiconductor transistor and manufacturing methods therefor. Within this specification the terms "semiconductor device" and "semiconductor component" are used synonymously. The formed semiconductor device is typically a vertical semiconductor device such as a vertical MOSFET with a source metallization arranged on the first surface, an insulated gate electrode arranged in a vertical trench next to the first surface and a drain metallization arranged on a second surface which is opposite to the first surface. Typically, the formed semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistive electric contact with a drain or collector electrode. The source region or emitter region is in low resistive electric contact with a source or emitter electrode. In the context of the present specification, the term "in low resistive electric contact" intends to describe that there is a low-ohmic current path between respective elements or portions of a semiconductor device when no voltages are applied to and/or across the semiconductor device. Within this specification the terms "in low resistive electric contact", "electrically coupled", and "in low resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and insulated from the body region and configured to form and/or control a channel region through the body region.

In the context of the present specification, the terms "field electrode" and "field plate" intend to describe an electrode which is arranged next to a semiconductor region, typically the drift region, insulated from the semiconductor region, and configured to expand a depleted portion in the semiconductor region by applying an appropriate voltage, typically a positive voltage for an n-type semiconductor region.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a bipolar semiconductor device from the forward direction or conducting direction in which a pn-load junction, for example the pn-junction between the body region and the drift region of a MOSFET, is forwardly biased to the opposite direction or reverse direction in which the pn-load junction is reversely biased.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance $R_{on}$ in the following.

FIG. 1A illustrates a vertical cross-section through a vertical field-effect semiconductor device 100. Semiconductor device 100 includes a semiconductor body 40 which extends between a first surface 101 and a second surface 102 arranged opposite to the first surface 101. The first surface 101 defines a vertical direction en. A vertical trench 50 extends from the first surface 101 into the semiconductor body 40. In the following, vertical trench 50 is also referred to as trench 50. Note that FIG. 1A corresponds only to a section through semiconductor device 100. Accordingly, only a left half of trench 50 and a right half of a mesa between two trenches 50 are illustrated in FIG. 1A.

Semiconductor 100 is typically a power semiconductor device with a plurality of vertical trenches and mesas arranged in an active area for switching and/or controlling a vertical current. The active area is typically surrounded by a peripheral area which extends to an outer edge, when seen from above. Furthermore, a gate pad and/or a gate runner area may be provided, for example between the active area and the peripheral area, to contact gate electrodes of the active area. Typically, semiconductor device 100 is manufactured at wafer level. Accordingly, a kerf region, which is adapted to be destroyed by chip dicing, is typically provided between the semiconductor devices 100 of the wafer.

In the exemplary embodiment illustrated in FIG. 1A, semiconductor body 40 includes an n-type drift region 4 into which the vertical trench 50 extends. The drift region 4 is electrically connected with a drain metallization 11 arranged on the second surface 102 via an n+-type drain region 9 extending to the second surface 102 and an optional n-type base layer and/or an optional n-type field stop layer (not shown in FIG. 1A). The optional n-type base layer may be provided to increase mechanical strength and to facilitate manufacturing. A p-type body region is arranged on and forms a pn-junction and a body diode, respectively, with drift region 4. Furthermore, an n+-type source region 8 forming a further pn-junction with a body region 5 is arranged on the body region 5 and extends to the first surface 101. An interlayer dielectric 35, for example a silicon oxide, is arranged on the first surface 101. A source metallization 10 is arranged on the interlayer dielectric 35 and electrically connected to the source region 8 and body region 5 using a conductive plug 10a, for example a highly doped poly-silicon plug 10a, to form a shallow trench contact. A p+-type body contact region 6 is arranged between the body region 5 and the conductive plug 10a to ensure a low resistivity connection between the source electrode 10 and the body region 5. A gate electrode 2 is arranged in an upper portion of the vertical trench 50 and insulated from the semiconductor body 40. A gate dielectric region 31 is arranged between the gate electrode 2 and source region 8, body region 5 and drift region 4. The gate electrode 2 is typically connected to a gate metallization (not shown in FIG. 1A) which is also arranged on the first surface 101, but insulated from the source metallization 10. Accordingly, the semiconductor device 100 has an insulated trench gate electrode 2 and may be operated as an n-channel trench MOSFET. Note that the doping relations may also be reversed to form a p-channel trench MOSFET 100.

In other embodiments, the source metallization 10 and conductive plug 10a, respectively, electrically contact the source region 8 and body contact region 6 at the first surface 101. In these embodiments, the body contact region 6 and typically also the body region 5 extend to the first surface 101.

A field electrode 1 is arranged in a lower portion of the vertical trench 50. The field electrode 1 is insulated from the semiconductor body 40 by a field dielectric region 3 and typically connected to the source metallization 10, for example in a different vertical cross-section. Furthermore, the field electrode 1 and gate electrode 2 are typically insulated from each other by an inter-electrode dielectric region 32. The field dielectric region 3 and inter-electrode dielectric region 32 form a dielectric structure which surround the field electrode 1 and insulates the field electrode 1 from the drift region 4 and gate electrode 1. The field dielectric region 3 and inter-electrode dielectric region 32 may even be comprised of the same dielectric material, for example silicon oxide, at least at an interface between them. For this reason, the interface between the field dielectric region 3 and inter-electrode dielectric region 32 is not always shown in the following Figures.

The insulated trench field electrode 1 significantly improves the device's performance by providing mobile charges at the interface with the field dielectric region 3 which are required to balance the donors of the n-type drift region 4 in blocking mode, i.e. when the body diode is reverse biased. While MOS-structures without field electrode exhibit a linearly decreasing vertical electric field having the maximum field-strength at the pn-junction between the body region 5 and drift region 4, there is also a lateral component of the electric field and the space-charge region in the drift region 4 expands mainly in lateral direction in the trench field-plate semiconductor device 100. Consequently, an almost constant vertical electric field distribution is gained and the required vertical drift-region length and thus on-resistance $R_{on}$ for a given breakdown voltage is significantly reduced. As explained above, higher breakdown voltages may be obtained using a thicker field dielectric region 3 and/or a larger vertical extension of the field dielectric region 3 and field electrode 1, respectively.

According to an embodiment, a cavity 15 is arranged in the vertical trench 50. Accordingly, a mechanical stress resulting from interfacial tensions between the field dielectric region 3 and semiconductor body 40 is at least reduced. This facilitates manufacturing of the semiconductor device 100 as wafer bowing is at least reduced. Furthermore, life-time of the semiconductor device 100 may be increased as mechanical stress is reduced during manufacturing and life-time of the semiconductor device 100.

To ensure large enough reduction of mechanical stress, the cavity 15 has a vertical extension of at least about 20 nm, more typically of at least about 50 nm, more typically of at least about 100 nm, more typically of at least about 200 nm, and even more typically of at least about 500 nm.

In the vertical cross-section, the horizontal extension of the cavity 15 is typically at least about 4 times smaller of the vertical trench 50 when measured in the same vertical depth. For example, the horizontal extension of the vertical trench 50 may be about 200 nm and the vertical extension of the cavity 15 may be about 50 nm in at least one vertical depth. In the vertical cross-section and in the at least one vertical depth, the horizontal extension of the cavity 15 is typically at least about a fifth of the horizontal extension of the vertical trench 50.

For the same reason the cavity 15 extends, in a direction which is substantially orthogonal to the vertical cross-section, substantially parallel to and/or along the field electrode 1. In other words, the extensions of the cavity 15 and field electrode 1 in a normal direction of the vertical cross-section may substantially match and may be larger than 1 µm (micron), larger than 10 µm or even larger than about 100 µm.

According to an embodiment, a plurality of smaller cavities having the same overall volume and/or the same overall extension is used instead of one larger cavity 15.

In the exemplary embodiment illustrated in FIG. 1A, the cavity 15 is partly surrounded by the field electrode 1 and the insulation structure formed by the field dielectric region 3 and inter-electrode dielectric region 32 surrounds the field electrode 1 and cavity 15.

The horizontal extension of the cavity 15 in the vertical cross-section may be comparatively small, for example only about 50 nm to about 100 nm. This is illustrated in FIG. 1B showing a vertical cross-section though a similar vertical field-effect semiconductor device 150 which may also be operated as a MOSFET. FIG. 1B illustrates only an upper section through the field-effect semiconductor device 150 as indicated by the horizontal plane s in FIGS. 1A and B. Furthermore, a thin oxide layer may be formed between the field electrode 1 and cavity 15. This oxide layer may be due to thermal processes when the field electrode 1 is comprised of poly-silicon. However, the thin oxide layer has only a minor influence on mechanical stress reduction.

Since the vertical trench 50 has, in the shown vertical cross-sections of FIGS. 1A and 1B, a larger extension in vertical direction compared to the horizontal direction, the cavity 15 has, in the vertical cross-section, typically also a maximum vertical extension which is larger than a maximum horizontal extension. This is also to ensure large enough reduction of mechanical stress in the semiconductor body 40.

Typically, the cavity 15 has a maximum vertical extension which is larger than about a third or even about more than a half of the maximum vertical extension of the vertical trench 50 as illustrated in FIGS. 1A and 1B. This ensures large enough reduction of mechanical stress in the semiconductor body 40.

In order to reduce internal stress of the semiconductor body 40 symmetrically, which is particularly important for reducing wafer bowing during manufacturing, the cavity 15 is, in the vertical cross-section, substantially centered with regard to a central vertical axis of the field electrode 1.

FIGS. 2A and 2B illustrate mechanical stress components $S_{yy}$ of the field-effect semiconductor device 150 of FIG. 1B and a similar field-effect semiconductor device 150' but without a cavity. In FIGS. 2A and 2B the numerically determined component $S_{yy}$ of the mechanical stress tensor is shown as a density plot with a linear scaling as shown in FIG. 1C. The y-co-ordinate corresponds to the vertical direction. As can be seen, the cavity 15 significantly reduces mechanical stress components $S_{yy}$ in the drift region 4 and mesa, respectively. This is also true for the mechanical stress components $S_{xx}$. with the x-coordinate corresponding to the horizontal direction of illustrated vertical cross-sections. Accordingly, the internal mechanical stress is reduced in the semiconductor body 40 and thus any bowing at least reduced.

FIGS. 3A to 5C illustrate vertical cross-sections through a semiconductor body 40 during method steps of a method for manufacturing a field-effect semiconductor device 150 as explained above with regard to FIG. 1B. For sake of clarity, only an upper section of the half of a unit cell of an active area is illustrated in FIGS. 3A to 5C. In a first process, the semiconductor body 40, for example a wafer or substrate, having a first surface 101 and a second or backside surface opposite the first surface 101 is provided. The normal direction $e_n$ of the first surface 101 is substantially parallel to the vertical direction. As illustrated in FIG. 3A, the semiconductor body 40 typically includes an n-type drift region 4 which extends to the first surface 101. The drift region 4 is in low resistivity connection with an n$^+$-type drain region 9 extending to the second surface. The drain region 9 is however not illustrated in FIG. 3A illustrating the semiconductor body 40 only between the first surface 101 and a horizontal plane through the semiconductor body 40. Furthermore, an optional n-type base layer and/or an optional n-type field stop layer (both not shown in FIG. 3A) may be arranged between the drift region 4 and the drain region.

FIG. 3A illustrates the semiconductor body 40 after further processes of defining an active area, forming vertical trenches 50 from the first surface 101 into the semiconductor body 40, typically by etching, and forming a field dielectric layer 3 on side walls and bottom walls of the vertical trenches 50. Note that only half of one of the plurality of vertical trenches 50 is illustrated in FIG. 3A. The field dielectric layer 3 may be formed by deposition or by thermal oxidation. A lower portion of the field dielectric layer 3 typically forms a field dielectric region in the semiconductor device 100 to be manufactured.

Referring to FIG. 3B, a conductive material, for example a highly doped poly-silicon, is deposited on the field oxide layer 3 to partially fill the vertical trench(es) 50 with a conductive layer 1. Typically, the conductive layer 1 is conformally deposited on the field oxide layer 3.

Referring to FIG. 3C, a filler material 17, which is selectively etchable with respect to the conductive layer 1 and field dielectric layer 3, is deposited on the conductive layer 1 to fill the vertical trench 50. For example, silicon nitride may be used as filler material when the field oxide layer 3 is comprised of silicon oxide.

Referring to FIG. 3D, the filler material 17 and the conductive layer 1 are etched back selectively to the field oxide layer 3.

Referring to FIG. 3E, the field dielectric layer 3 is etched back selectively to the filler material 17 and the conductive layer 1 to expose an upper portion of the side walls of the vertical trench 50.

Referring to FIG. 4A, the filler material 17 is etched back selectively with respect to the conductive layer 1 and the field dielectric layer 3 using an isotropic etching process.

Referring to FIG. 4B, the conductive material is again deposited to form a further conductive layer 1a on and comprised of the same material as the conductive layer 1.

Referring to FIG. 4C, the conductive material is etched back, typically using an isotropic etch process followed by an anisotropic etching process.

Thereafter, the remaining filler material 17 is completely removed, typically by etching. Accordingly, an open cavity 15a is formed in the conductive layer 1 of the vertical trench 50. The resulting semiconductor structure 150 is illustrated in FIG. 4D.

Thereafter, the open cavity 15a is closed to from a closed cavity on the conductive layer 1 of the vertical trench 50. In the exemplary embodiment illustrated in FIG. 4E, a further oxide layer is formed, typically by deposition or thermal oxidation, to close open cavities 15 and to form an inter-electrode dielectric between the conductive layer 1 forming a field electrode in the device to be manufactured and a gate electrode to be formed thereon.

The closed cavity 15 is typically formed such that the cavity 15 has a horizontal extension which is larger than about 50 nm and a vertical extension which is larger than the horizontal extension. Accordingly, a mechanical stress resulting from interfacial tensions between field dielectric region 3 and semiconductor body 40 is reduced. This facilitates manufacturing of semiconductor device 150 on wafer level as wafer bowing is at least reduced. Note that closed cavities may be formed in each of the vertical trenches 50 of a power semiconductor device 100 or only in some of them.

Referring to FIG. 5A, the further oxide layer is removed from upper portions of the trench side walls.

Thereafter, a thermal oxidation is typically performed to form a gate dielectric region 31 on the side wall of the vertical trench 50 and to thicken the inter-electrode dielectric. The resulting semiconductor structure 150 is illustrated in FIG. 5B. The processes of removing the further oxide layer and thermal oxidation may be omitted when the further oxide layer is formed as a thermal oxide. In this embodiment, the further oxide layer formed on the sidewalls of the vertical trenches 50 forms the gate dielectric region 3.

Thereafter, a p-type body region 5 is formed in the drift region 4 next to the vertical trench 50 and an n+-type source region 8 is formed on the body region 5, typically by implantation and subsequent drive in. Further, a p+-type body contact region 6 may be formed in the body region 5 by implantation. A gate electrode 2 may be arranged in an upper portion of the vertical trench 50, for example by deposition and back etching of poly-silicon. An interlayer dielectric 35, for example a silicon oxide, may be arranged on the first surface 101. Thereafter, a shallow trench may be formed through the interlayer dielectric 35 at least to the first surface 101, for example extending into the body region 5 and body contact region 6, respectively. The body contact region 6 may also be formed after forming the shallow trench. A source metallization 10 is arranged on the interlayer dielectric 35 and electrically connected to the source region 8 and body region 5. This may be done using a conductive plug (not shown), for example a highly doped poly-silicon plug, to form a shallow trench contact. Further, a gate contact between the gate electrodes 2 and a gate metallization (not shown) arranged on the first surface 101 may be formed through the interlayer dielectric 35. Further, a drain metallization may be formed on the second surface. The resulting semiconductor device 150 is illustrated in FIG. 5C and may be operated as a MOSFET.

Alternatively, the following processes may be performed after forming a conductive layer 1 similar as explained above with regard to FIG. 3B. However, the conductive layer 1 is formed such that at least a lower portion of the vertical trench 50 is completely filled. The conductive layer 1 is etched back to expose the field dielectric layer 3 at least above the first surface 101 and in an upper portion of the vertical trench 50 above the back-etched conductive layer 1. Thereafter, a spacer region, which may be made of silicon oxide or silicon nitride, is formed on the exposed field dielectric layer 3. Thereafter, the conductive region 1 is etched back using plasma etching with a taper of more than 90° to form a vertically elongated open cavity in the conductive layer 1. Thereafter, the spacer region is removed. The resulting semiconductor structure is similar as illustrated below in FIG. 7A.

Thereafter, the field dielectric region 3 may selectively be etched to expose the side walls of the vertical trench 50 in the upper portion. Thereafter, a gate dielectric region 31 may be formed on the exposed side walls, for example by thermal oxidation. In so doing, the cavity 15 is closed. In embodiments in which the gate dielectric region 31 is formed by thermal oxidation and in which the conductive layer 1 is made of poly-silicon, an inner surface of the conductive layer 1 is covered with an oxide layer. Forming the gate dielectric region 31 may include forming and removing a sacrificial oxide layer on the exposed side walls.

Further processing typically includes forming a p-type body region 5, an n+-type source region 8, a p+-type body contact region 6, a gate electrode 2, an interlayer dielectric 35, a conductive plug, a source metallization 10, a drain metallization and a gate metallization similar as explained above with regard to FIG. 5C.

To avoid electrical influence of surface charges, which may be formed on the surface cavity during processing, the closed cavity is typically completely surrounded by the field electrode 1. In the following further processes for forming such a semiconductor device are explained.

FIGS. 6A to 7B illustrate vertical cross-sections through a semiconductor body 40 during method steps of a method for manufacturing a field-effect semiconductor device 200. After processes of forming a vertical trench 50 into the semiconductor body 40 and forming a field dielectric layer 3 similar as explained above with regard to FIG. 3A, a conductive material, typically poly-silicon, is deposited and partly etched back to form a conductive layer 1 which fills a lower portion of the vertical trench 50. The resulting semiconductor structure 200 is illustrated in FIG. 6A which may correspond to an upper section of a typical unit cell through an active area of the semiconductor device 200.

Referring to FIG. 6B, a spacer region 13, against which the conductive material 1 is selectively etchable, for example a silicon oxide spacer or silicon nitride spacer, is formed on the conductive layer 1. This may include conformal depositing.

Thereafter, the conductive layer 1 is etched back with a taper of more than 90°, for example using plasma etching to form a vertically elongated open cavity 15a which has, in the vertical cross-section, a substantially convex surface.

Thereafter, the spacer region 13 is typically removed. The resulting semiconductor structure 200 is illustrated in FIG. 7A.

Referring to FIG. 7B, an upper portion 1a of the conductive material is formed by depositing to close the cavity 15. The closed cavity 15 is, in the vertical cross-section, completely surrounded by the conductive material 1, 1a.

Thereafter, the conductive material 1, 1a may be etched back, typically using isotropic etching.

Thereafter, an inter-electrode dielectric may by formed on the remaining conductive material 1, 1a forming a field electrode in the semiconductor device to be manufactured.

Further, a body region, a body contact region and a source region may be formed in the mesa adjoining the vertical trench 50. An insulated gate electrode may be formed above the field electrode, an interlayer dielectric 35 may be formed on the first surface 101, and the body contact region and a source region may be contacted with a source metallization on the first surface 101 through the interlayer dielectric 35, for example via a shallow trench contact.

Referring to FIG. 8 illustrating a vertical cross-section through a semiconductor body 40, method step of a method for forming a field-effect semiconductor device 250 are explained. After processes of forming a vertical trench 50 into the semiconductor body 40, forming a field dielectric layer 3 in the vertical trench 50 and forming a conductive layer 1 on the field dielectric layer 3, similar as explained above with regard to FIGS. 3A and 3B, a planarization process, for example a CMP-process (chemical mechanical polishing), may be performed.

Thereafter, a dielectric material 32 such as BPSG (BoroPhosphoSilicate Glass) or TEOS (TetraEthylOrthoSilicat) is deposited, for example using a plasma-enhanced chemical vapor deposition process (PECVD), so that the conductive layer 1 is covered by a thin layer of the dielectric material 32 and that a closed cavity 15 is formed due to the coalescing of the dielectric material 32 close to the first surface 101. Further, shallow trenches 53 that may be used for contacting body and source regions are illustrated in FIG. 8. The shown field electrode structure typically corresponds to a trench portion of a peripheral area without a gate electrode illustrated above the field electrode 1 including the cavity 15.

However, it goes without saying, that closing of the cavity 15 with the dielectric material 32 may also be done after back-etching of the field dielectric layer 3 and conductive layer 1 in a lower portion of a similar vertical trench 50 in an active area. Prior to forming the gate electrode, the dielectric material 32 may be removed from the first surface, for example using a CMP-process, and back-etching.

For example, a silicon nitride mask may be formed after the CMP-process to cover the dielectric material 32 above the closed cavity 15. Thereafter, the field dielectric layer may be etched to expose an upper portion of the side walls of the vertical trench 50. Thereafter, an inter-electrode dielectric and a gate dielectric region may be formed on the closed cavity 15 and the exposed sidewalls respectively. Thereafter, a gate electrode may be formed on the gate dielectric region.

Referring to FIGS. 9 and 10 illustrating vertical cross-sections through a semiconductor body 40, method steps of a method for forming a field-effect semiconductor device 300 are explained. The semiconductor to be manufactured is typically a power semiconductor device with a plurality unit cells arranged in an active area for switching and/or controlling a vertical current. For sake of clarity, only a section through one of the unit cells is shown in FIGS. 9A to 9C. After processes of forming a vertical trench 50 into the semiconductor body 40, forming a field dielectric layer 3 in a vertical trench 50 and forming a thin conductive layer 1 on a field dielectric layer 3, similar as explained above with regard to FIGS. 3A and 3B, a dielectric region 17 which may include a closed cavity 15 is formed on the thin conductive layer 1 in a lower portion of the vertical trench 50. For example, a silicon nitride is deposited and etched back selectively to the material of the thin conductive layer 1 to form the dielectric region 17. The thin conductive layer 1 may, for example be formed by deposition of poly-silicon. Thereafter, a further thin conductive layer 1a comprised of the same conductive material as the thin conductive layer 1 is deposited. The resulting semiconductor structure 300 is illustrated in FIG. 9A. Thereafter, the thin conductive layer 1 and the further thin conductive layer 1a may be removed from the first surface using a CMP-process.

Referring to FIG. 9B, the conductive material 1, 1a is etched back, typically by using an anisotropic etching process.

Thereafter, the field dielectric layer 3 is etched back to expose upper portion of the side wall of the vertical trench 50. Thereafter, a gate dielectric region 31 and an inter-electrode dielectric region 33 are typically formed on the side wall of the vertical trench 50 and the back-etched conductive material 1, 1a which typically forms in the semiconductor device to be manufactured a field electrode. Thereafter, a gate electrode 2 is typically formed in the remaining part of vertical trench 50, for example by depositing of highly doped poly-silicon and a planarization process and/or back-etching. The resulting semiconductor structure is illustrated in FIG. 9C.

Referring to FIG. 10, process steps for removing the dielectric region 17 are explained. FIG. 10 illustrates in a vertical cross-section through the semiconductor body 40, which is substantially orthogonal to the vertical cross-sections of FIG. 9A to 9C, an end portion of the vertical trench 50 next to an edge 18 and extending into a peripheral area 120 including optional edge-termination structures (not shown in FIG. 10), respectively. A mask 18, for example a TEOS-mask or a resist-mask, is formed on the first surface 101 to protect the formed gate electrode 2 and gate dielectric region 31.

Thereafter, an anisotropic etching of the conductive material of the field electrode 1, 1a is used to remove a portion 1a' of the conductive material extending to the first surface 101 in the end portion of the vertical trench 50 and to expose the dielectric region 17.

Thereafter, the dielectric region 17 may be partly or even completely removed by etching. Accordingly, a large cavity may be formed. Typically, a wet chemical etching is used to remove the dielectric region 17. Note that wet chemical etching is facilitated by the capillary effect during forming the large cavity.

Thereafter, a short thermal oxidation may be performed in embodiments using poly-silicon as material of the conductive material of the field electrode 1, 1a. Accordingly, a defined insulated surface may be formed on the field electrode 1, 1a.

Furthermore, a body region, a body contact region and a source region may be formed in the mesa adjoining the vertical trench 50, for example prior to forming an insulated gate electrode 2. An interlayer dielectric 35 may be formed on the first surface 101, and the body contact region and a source region may be contacted with a source metallization on the first surface 101 through the interlayer dielectric 35, for example via a shallow trench contact. Further, a gate metallization may be formed on the first surface 101. The formed semiconductor device 300 may be operated as a MOSFET.

The formed semiconductor devices as explained above have in common that they include a semiconductor body with a first surface defining a vertical direction. The semiconductor body 40 includes in a vertical cross-section a vertical trench which extends from the first surface into the semiconductor body and includes a field electrode, a cavity which is at least partly surrounded by the field electrode, and an insulation structure surrounding at least the field electrode. Typically, an insulated gate electrode is formed above the field electrode.

The cavity has, in the vertical cross-section, typically a vertical extension which is larger than about 20 nm, more typically larger than about 50 nm, more typically larger than about 100 nm, more typically larger than about 200 nm, and even more typically larger than about 500 nm. Note that the cavity is formed to reduce mechanical stress and not an unwanted product of a process variation or a processing failure which may lead to small cavities of up to a few nm.

Typically, the cavity has, in the vertical cross-section, a maximum horizontal extension and a maximum vertical extension which is larger than the maximum horizontal extension. However, in a horizontal direction which is substantially orthogonal to the vertical cross-section, the extension of the cavity may be even larger, for example in the mm-range depending on size of the semiconductor device.

The semiconductor devices may include a plurality of cavities to evenly reduce mechanical stress, for example a plurality of cavities forming a lattice.

FIGS. 11 to 16 illustrate vertical cross-sections through a semiconductor body 40 during method steps of a method for forming a field-effect semiconductor device 400. In a first process, a semiconductor body 40, for example a wafer or substrate, having a first surface 101 and a second or backside surface 102 opposite the first surface 101 is provided. The normal direction $e_n$ of the first surface 101 is substantially parallel to the vertical direction. As illustrated in FIG. 11, the semiconductor body 40 typically includes an n⁻-type drift region 4 which extends to the first surface 101. The drift region 4 is in low resistivity connection with an n⁺-type drain region 9 extending to the second surface 102.

FIG. 11 illustrates the semiconductor body 40 after further processes of defining an active area 110 and a peripheral area 120 which extends to an outer edge 18 and typically circumferentially surrounds the active area 110, forming wide vertical trenches 51 from the first surface 101 into the semiconductor body 40, and forming dielectric regions or layers 3a on side walls of the wide vertical trenches 51. Typically, the wide vertical trenches 51 are formed by etching through the drift region 4 and partially into the drain region 9. Depending on desired blocking-capability of the semiconductor device 400 to be manufactured, the drift region 4 may have a vertical extension of about 50 μm to about 60 μm. The horizontal extension of the wide vertical trenches 51 may, in the vertical cross-section, range from about 1 μm to about 6 μm. The dielectric regions 3a may be formed by deposition or by thermal oxidation and may have, in the vertical cross-section, a horizontal extension of about 50 nm to about 150 nm. Furthermore, any dielectric region formed on the bottom of the wide vertical trenches 51 is removed, for example using an anisotropic etching process.

In the exemplary embodiment, a p-type epitaxial layer 4a, an n⁻-type epitaxial layer 4b, an n⁺-type epitaxial layer 4c and an n⁻-type epitaxial layer 4d are formed by selective epitaxy in the wide vertical trenches 51. Further, a CMP-process may subsequently be used to remove any semiconductor material protruding from the first surface 101. Accordingly, drift control regions 4d are formed which are separated form neighboring drift regions 4 in the active area 120 by the dielectric regions 3a which typically form in the semiconductor device to be manufactured an accumulation oxide. Furthermore, a buried pin-diode structure is formed by the epitaxial layers 4a, 4b, 4c between the drift control regions 4d and the drain region 9. The resulting semiconductor structure 400 is illustrated in FIG. 12. The formed buried pin-diode structure is only an example. Alternatively, a dielectric region may be formed between each of the drift control regions 4d and drain region 9.

Thereafter, a mask 18 is typically formed on the first surface 101 having a recess above the dielectric region 3a in the peripheral area 120. The mask 18 is used as an etching mask for removing the exposed dielectric region 3a forming a placeholder 3a for a cavity to be formed. In so doing, a vertical trench 50 and open cavity 15a, respectively, is formed in the peripheral area 120. The resulting semiconductor structure 400 is illustrated in FIG. 13.

In the exemplary embodiment illustrated in FIG. 13, the vertical trench 50 and open cavity 15a, respectively, extends from the first surface 101 partially into the drain region 9.

Accordingly, the vertical trench 50 has, in the vertical cross-section, a comparatively high aspect ration of more than about 5 or even more than about 10, i.e. ratio between maximum vertical extension and maximum horizontal extension. However, the ratio between cavity depth and cavity width may vary in a wide range.

Thereafter, mask 18 may be removed.

Figure 14:
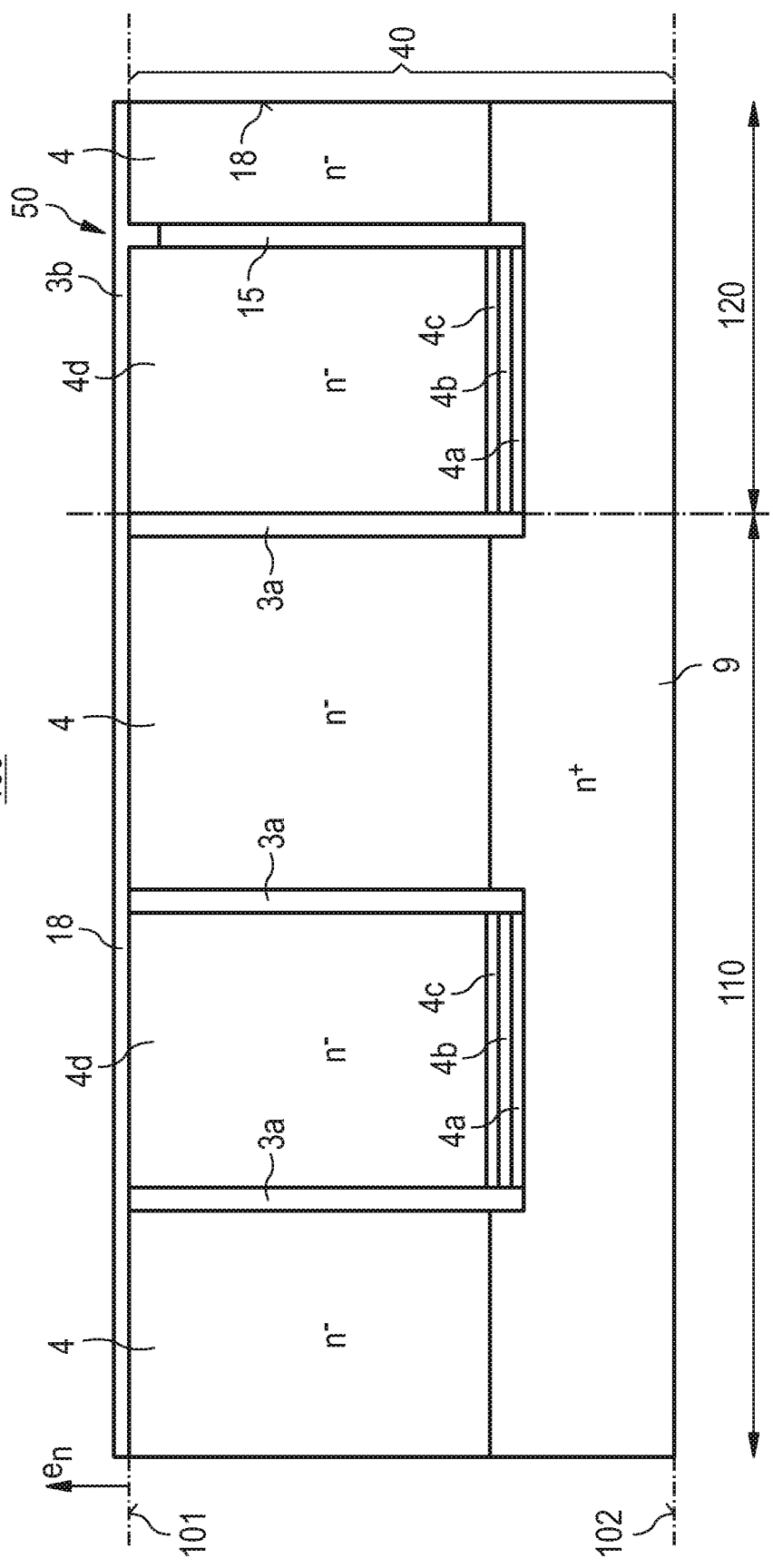

Referring to FIG. 14, a dielectric layer 3b is formed on the first surface 101. Typically, non-conformal depositing of for example TEOS is used to form the dielectric layer 3b. Accordingly, a portion of the dielectric layer 3b extends into the vertical trench 50 and forms a dielectric plug. Thereby, a closed cavity 15 is formed. Typically, the closed cavity 15 has a comparatively high aspect ratio. The aspect ratio of the cavity 15 may be higher than about 2, more typically higher than about 5 and even more typically higher than about 10.

The closed cavity 15 typically forms an expansion joint for reducing mechanical stress in the semiconductor device 400.

Optionally, the vertical trench 50 and cavity 15, respectively, may be filled with an elastic material such as a resin, a doped or un-doped oxide, an imide, an aerogel or the like, prior to closing.

Figure 15:
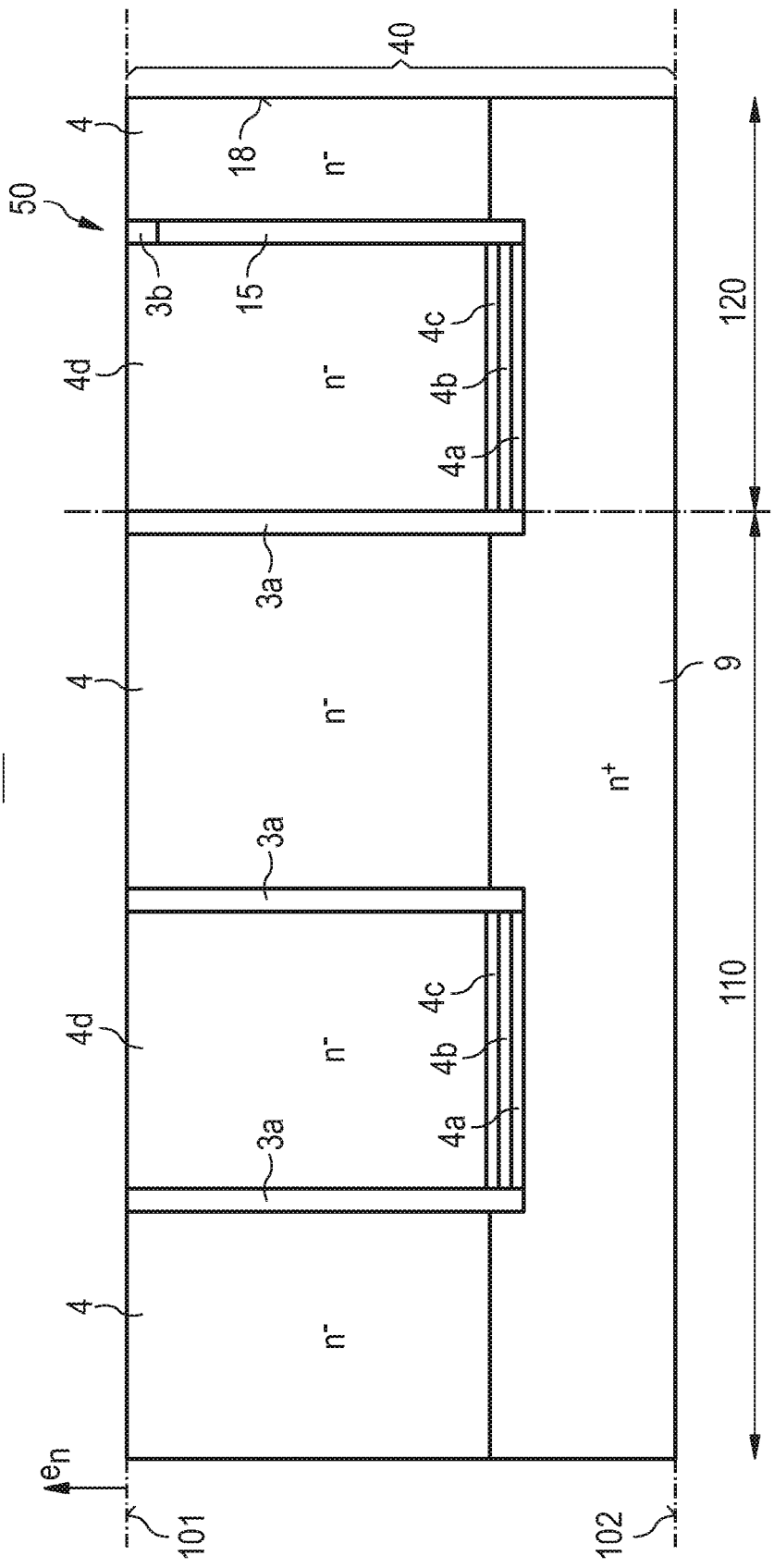

Referring to FIG. 15, the dielectric layer 3b is removed from the first surface 101 so that a dielectric plug 3b remains in an uppermost portion of the vertical trench 50. The dielectric plug 3b may also be made of other dielectric materials such as silicon nitride, siliconoxynitride or the like.

Typically, the semiconductor device 400 is manufactured on wafer level. In the exemplary embodiment illustrated in FIG. 15, the closed cavity 15 is formed between the active area 110 and outer edge 18 and sawing edge 18 of the wafer between different semiconductor devices 400, respectively. Alternatively, or in addition, the closed cavity 15 may be formed in cutting regions or kerf regions of the wafer between different semiconductor devices 400. Accordingly, wafer bowing may be reduced and thus manufacturing of the semiconductor devices 400 facilitated.

Even further, closed cavities 15 may be formed in the active area 110 and/or below a gate pad and/or a gate runner (not shown). For example, closed cavities 15 may be formed between every, every second, or every third unit cell of the active area 110, i.e. between every $n^{th}$ unit cell of the active area 110, and/or in every, every second, or every third unit cell of the active area 110, i.e. in every $n^{th}$ unit cell of the active area 110, with n being a positive natural number. Accordingly, closed cavities 15 may form a lattice to evenly reduce mechanical stress and bowing, respectively.

Figure 16:
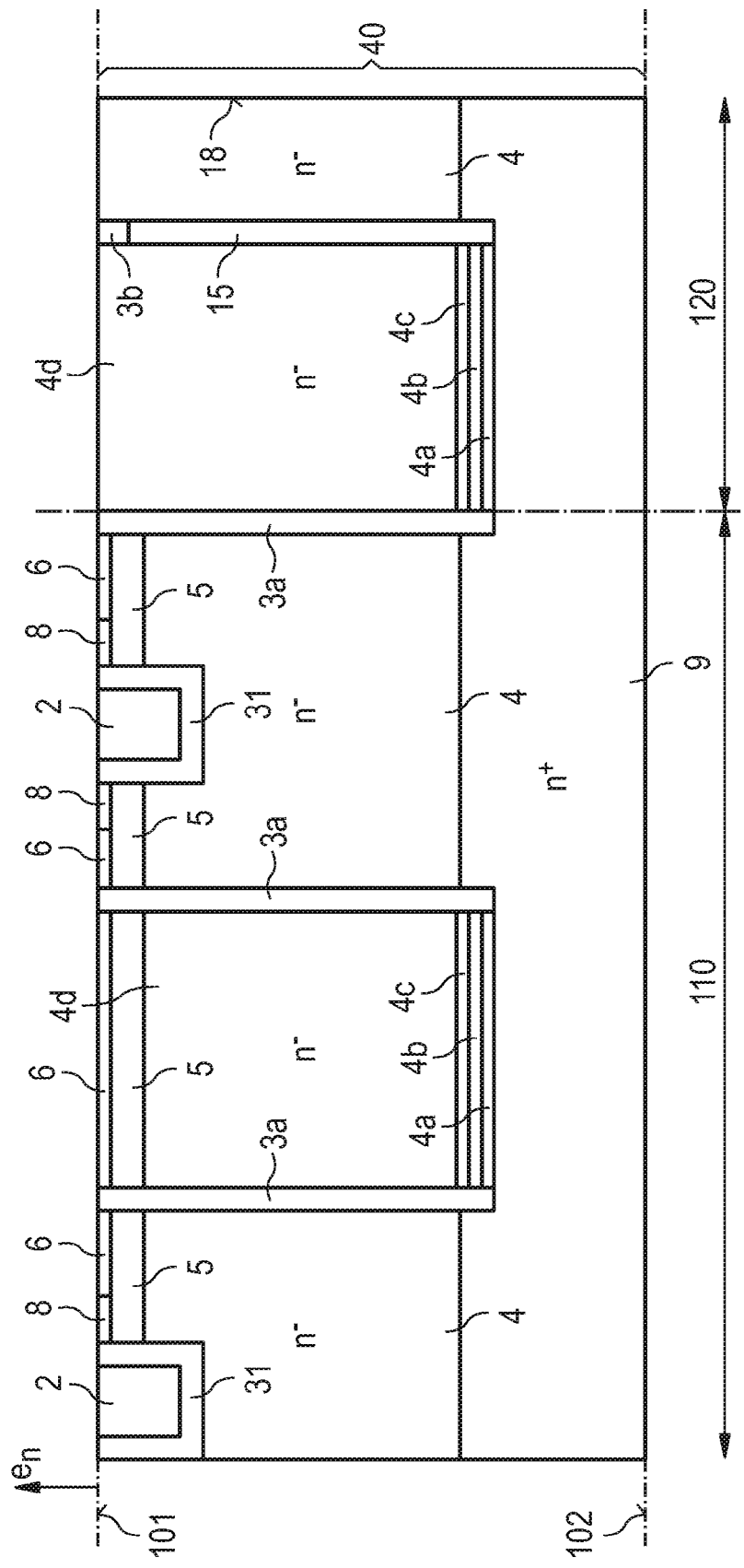

As illustrated in FIG. 16, the vertical extension of the closed cavity 15 is typically larger than the horizontal extension of the closed cavity 15, for example by a factor of more than about two, more typically by a factor of more than about four or even more than about five or ten.

Thereafter, insulated trench gate electrodes 2 may be formed in the active area 110. For example, further vertical trenches are formed in the drift region 4, a gate dielectric region 31 is formed at sidewalls and the bottom wall of the further vertical trenches and a gate electrode 2 is formed on the gate dielectric region 31 insulating the trench gate electrode 2 from the semiconductor body 40 and semiconductor wafer, respectively. The gate dielectric regions 31 extend from the first surface 101 into the semiconductor body 40 but vertically not as deep as the dielectric regions 3a.

In other word, in the active area 110 the dielectric regions 3a are formed that extend from the first surface 101 vertically deeper into the semiconductor body or wafer 40 than the gate dielectric regions 31.

Typically, a maximum distance of the dielectric regions 3a to the first surface 101 substantially matches a maximum distance of the cavity 15 to the first surface 101. Accordingly, a sufficient reduction of mechanical stress is achieved.

Thereafter, p-type body regions 5, p+-type body contact regions 6, and n⁺-type source regions 8 are typically formed at least next to the insulated trench gate electrodes 2. The resulting semiconductor device 400 is illustrated in FIG. 16.

Thereafter, an interlayer dielectric may be formed on the first surface 101, and the body contact regions 6 and the source regions 8 may be contacted with a source metallization formed on the first surface 101 through interlayer dielectric 35. Further a gate metallization may be formed on the first surface 101 and in contact with the insulated trench gate electrodes 2, and a drain metallization may be formed on the second surface 102 to contact the drain region 9. Accordingly, a three-terminal semiconductor device 400 is formed that may be operated as a TEDFET.

According to an embodiment, the semiconductor device 400 includes a source region 8, a drift region 4 and a body region 5 forming a pn-junction at least with the source region, a gate electrode 2 which is insulated from the semiconductor body 40 by a gate dielectric 31 region adjoining the source 8 region, the body region 5 and the drift region 4, and a dielectric region 3a extend at least along the drift region 4.

The doping relations of the illustrated semiconductor devices may also be reversed. Furthermore, the drift region 4 may be of n⁻-type or p⁻-type independent of doping type of the body region 5. This is for the following reasons. The function of the drift control region 4d is to control a conducting channel in the drift regions 4 along the dielectric region 3a if the MOSFET-structure is in its on-state. Drift control region 4b therefore serves to reduce the on-resistance of the overall transistor component. Unlike in usual MOSFETs, the drift region 4 may therefore, disregarding of the type of the MOS transistor structure, be n-doped or p-doped. If, for example, in an n-type MOSFET-structure the drift region 4 is n-doped, then an accumulation channel is formed along the dielectric region 3a and controlled by the drift control region 4d. In this embodiment, the dielectric region 3a is also referred to as accumulation layer and accumulation oxide, respectively. If the drift region 4 is p-doped in an n-type MOSFET-structure, then an inversion channel forms along the dielectric region 3a in the drift region 4, if the component is in its on-state. Like a usual MOSFET this component is in its on-state if a voltage is applied between a source region 8 and a drain region 9 and between source and drain metallizations respectively, and if a suitable electrical potential is applied to the gate electrode 2 that effects a conducting channel in the body region 5 between the source region 8 and drift region 4.

Figure 17:
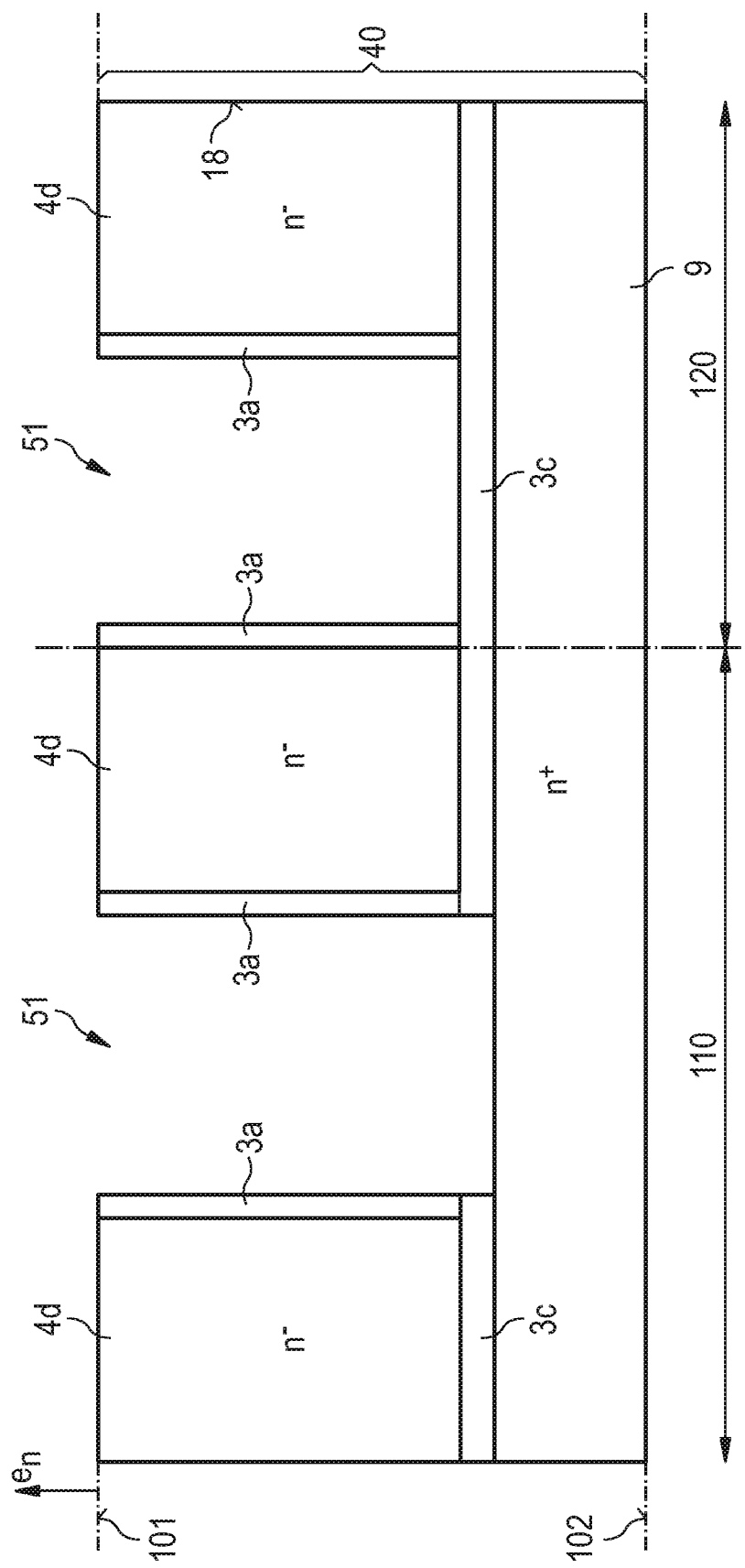
FIGS. 17 and 18 illustrate vertical cross-sections through a semiconductor body during method steps of a method according to further embodiments.
Figure 18:
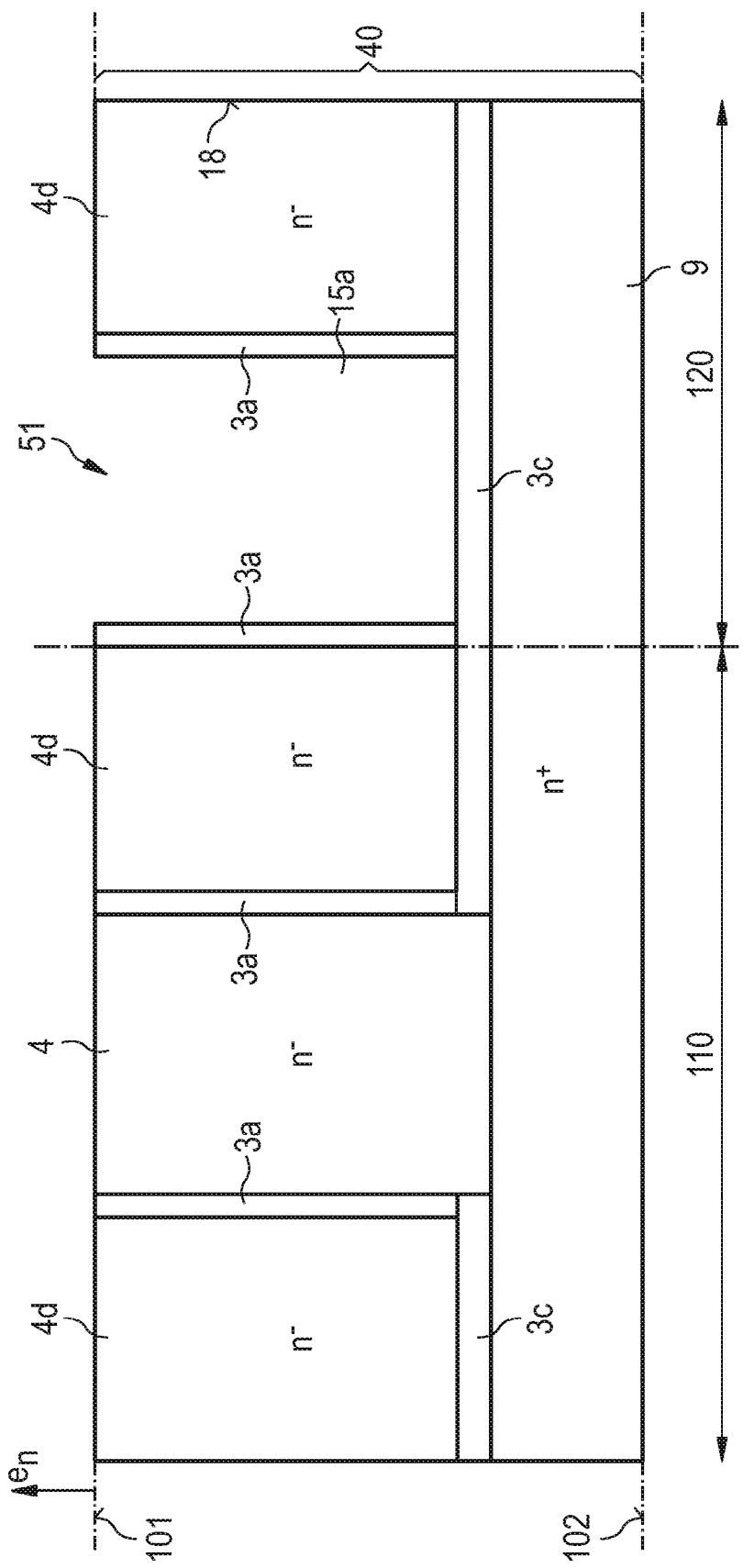

FIGS. 17 and 18 illustrate vertical cross-sections through a semiconductor body 40 during method steps of a method for forming a field-effect semiconductor device 500. FIG. 17 illustrates a semiconductor body 40 after processes of epitaxial over growth of oxide regions 3c formed on a wafer with an $n^+$-type drain region 9, defining an active area 110 and a peripheral area 120 which extends to an outer edge 18, forming wide vertical trenches 51 from the first surface 101 into the semiconductor body 40, and forming dielectric regions or layers 3a on side walls of the wide vertical trenches 51. In so doing, drift control regions 4d are formed. Forming the wide vertical trenches 51 and dielectric regions 3a may be done similar as explained above with regard to FIG. 11. However, etching of the wide vertical trenches 51 stops in peripheral area 120 at oxide regions 3c while the wide vertical trenches 51 of the peripheral area 110 extends at least to the drain layer 9. Accordingly, a subsequent process of selective epitaxy only fills the wide vertical trench 51 in the active area 110.

FIG. 18 illustrates the semiconductor structure 500 after a CMP-process to remove any epitaxially deposited semiconductor material from the first surface 101. Accordingly, a drift region 4 is formed in the active area 110. Further, an open cavity 15a and expansion joint 15a, respectively, is formed in the peripheral area 120. The horizontal extension of the open cavity 15a in the illustrated vertical cross-section may be adjusted by the etching mask used for etching the wide vertical trenches 51.

Similar as explained above with regard to FIGS. 14 and 15, the open cavity 15a may be closed and/or filled with an elastic material. Note that open cavities may alternatively or in addition be formed in the active area 110 and/or a kerf region. According to an embodiment, a plurality of cavities is formed on a lattice to evenly reduce mechanical stress and bowing, respectively.

Thereafter, insulated trench gate electrodes, body regions, body contact regions, source regions, an interlayer dielectric, a source metallization, a gate metallization and a drain metallization may be formed similar as explained above with regard to FIG. 16. Accordingly, a TEDFET 500 having an expansion joint may be provided.

Figure 19:
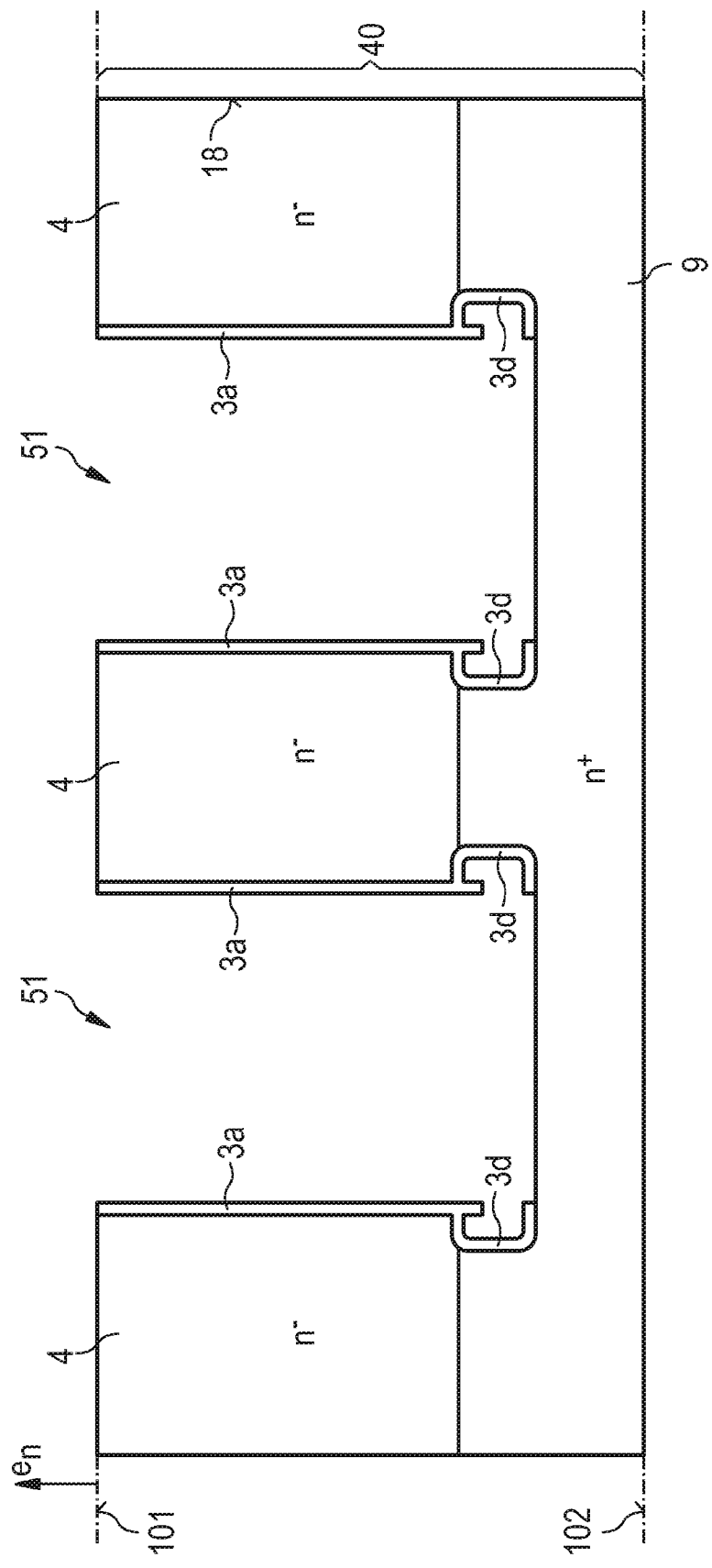
FIGS. 19 and 20 illustrate vertical cross-sections through a semiconductor body during method steps of a method according to further embodiments.
Figure 20:
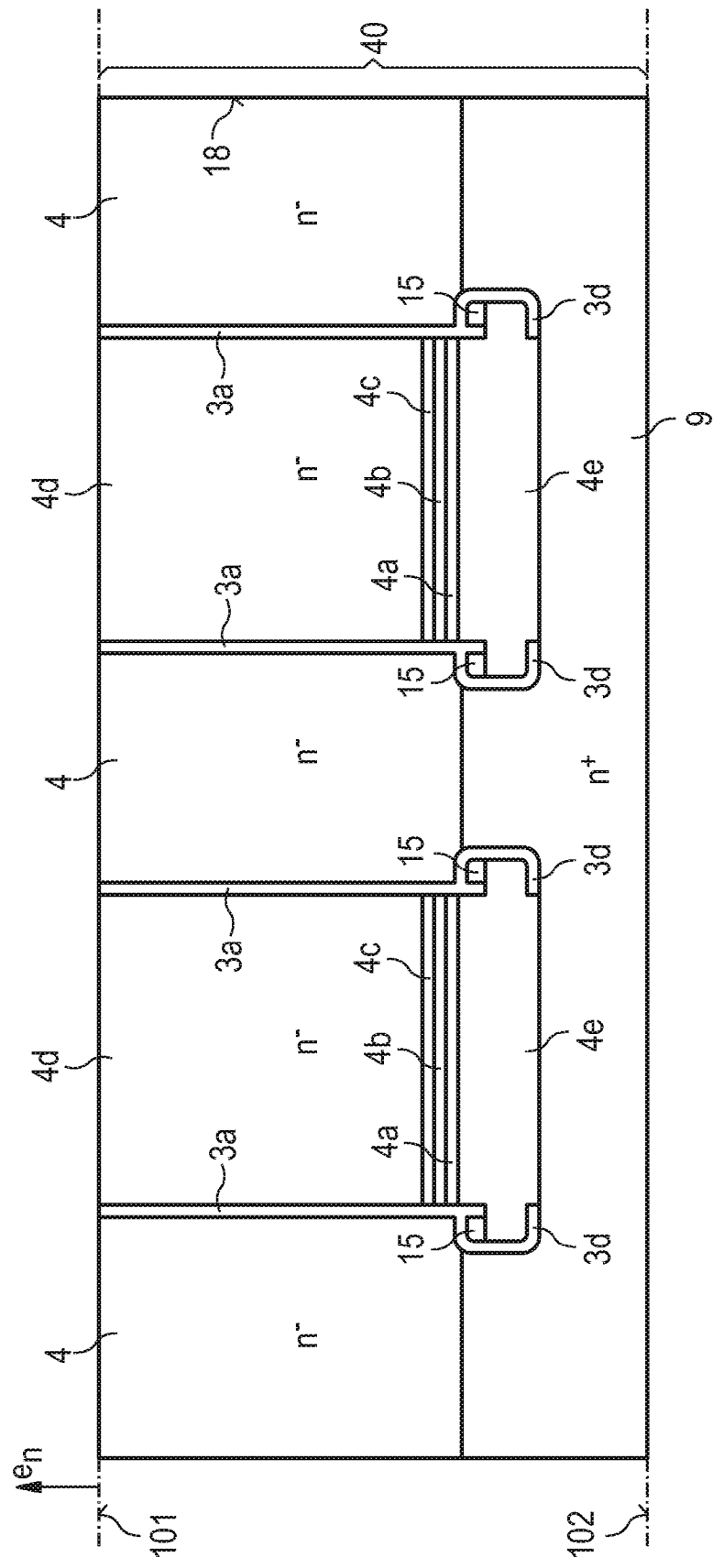

FIGS. 19 and 20 illustrate vertical cross-sections through a semiconductor body 40 during method steps of a method for forming a field-effect semiconductor device 600. The first processes are similar as explained above with regard to FIG. 11. Thereafter, the bottom portions of the vertical trenches 51 are widened, typically using wet-chemical etching with high selectivity of etching the semiconductor material. Accordingly, undercuts of the lowermost portion of dielectric regions 3a are formed. Thereafter, a thermal oxidation process is used to form a thin oxide layer 3d, of for example 20 nm to about 150 nm thicknesses, on the widened bottom portions of the vertical trenches 51. The resulting semiconductor structure 600 is illustrated in FIG. 19 after a further optional process of removing the thin oxide layer 3d from a central part of the bottom of the vertical trenches 51 to expose the drain layer 9.

Referring to FIG. 20, an $n^-$-type epitaxial layer 4e, a p-type epitaxial layer 4a, an $n^-$-type epitaxial layer 4b, an $n^+$-type epitaxial layer 4c and an $n^-$-type epitaxial layer 4d are formed by selective epitaxy in the widened vertical trenches 51. Further, a CMP-process may subsequently be used to remove any semiconductor material protruding from the first surface 101. Accordingly, drift control regions 4d are formed which are separated form neighboring drift regions 4 in the active area 120 by dielectric regions 3a. Furthermore, an optional pin-diode structure is formed by the epitaxial layers 4a, 4b, 4c between the drift control regions 4d and the drain region 9. Alternatively, a dielectric region may be formed between each of the drift control regions 4d and drain region 9. Furthermore, closed cavities 15 and expansion joints 15, respectively, are formed next to a lowermost portion of the dielectric regions 3c.

In a vertical cross-section which is substantially orthogonal the vertical cross-section of FIG. 20 and crosses a cavity 15, a maximum horizontal extension of the cavity 15 typically exceeds maximum horizontal extension of the cavity 15, typically by a factor of at least about 2, more typically by a factor of at least about 5, and even more typically by a factor of at least about 2. The maximum vertical extension of the cavities 15 is typically larger than about 20 nm, and more typically larger than about 50 nm.

Thereafter, insulated trench gate electrodes, body regions, body contact regions, source regions, an interlayer dielectric, a source metallization, a gate metallization and a drain metallization may be formed similar as explained above with regard to FIG. 16. Accordingly, a TEDFET 600 having an expansion joint may be provided.

The formed semiconductor devices explained above with regard to FIGS. 11 to 20 have in common that the semiconductor body includes a first surface defining a vertical direction, a substantially vertically orientated outer edge, and an active area which is spaced apart from the outer edge. The active area includes a plurality of insulated gate electrodes arranged next to the first surface and extending into the semiconductor body and a plurality of dielectric regions which are spaced apart from the insulated gate electrodes and extend from the first surface into the semiconductor body and vertically below the insulated gate electrodes. The semiconductor body further includes a cavity arranged below the first surface and between the outer edge and the active area and/or a cavity arranged next to a lowermost portion of at least one of the plurality of dielectric regions.

The formed semiconductor devices as explained herein have in common that they include a semiconductor body with a first surface defining a vertical direction. The semiconductor body includes a trench gate electrode which extends from the first surface into the semiconductor body and is insulated from the semiconductor body a gate dielectric region and a cavity which is arranged, in the vertical direction, at least partially below the trench gate electrode, and which is configured to reduce mechanical stress in the semiconductor body.

Note that the processes of forming the semiconductor devices as explained herein are performed such that that one or more cavities are produced for sure. This is different to forming small holes of up to a few nm due to unwanted process variations.

Typically, the cavity has, in a vertical cross-section, a horizontal extension which is larger than about 20 nm, more typically larger than about 50 nm, and a vertical extension which is larger than the horizontal extension, typically by at least a factor of about 2, more typically by at least a factor of about 5 and even more typically by at least a factor of about 10.

The cavity typically has, in a direction which is substantially orthogonal to the vertical cross-section, a horizontal extension which is larger than the horizontal extension in the vertical cross-section, for example by a factor of more than about five. Typically, the horizontal extension of the cavity, in the direction which is substantially orthogonal to the vertical cross-section, may be larger than 1 µm, larger than 10 µm or even larger than about 100 µm. This is also different to accidentally forming small holes due to process variations or a process failure.

Typically, the semiconductor device includes a plurality of cavities forming a lattice. For example, the plurality of cavities may form a regular lattice in the active area, the peripheral area and/or the kerf region. Note that the pitch, the vertical extensions and also the horizontal extensions of cavities may be different in the active area, the peripheral area and the kerf region.

According to an embodiment, the cavity is arranged completely within the trench gate electrode when seen from below. For example, the cavity may be completely enclosed by a trench field electrode formed below the trench gate electrode.

According to an embodiment, the cavity may be filled with an elastic material.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over," "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a field-effect semiconductor device, the method comprising:
   providing a semiconductor body with a first surface defining a vertical direction;
   defining an active area;
   forming a vertical trench from the first surface into the semiconductor body;
   forming a field dielectric layer at least on a side wall and a bottom wall of the vertical trench;
   depositing a conductive layer on the field dielectric layer;
   forming a closed cavity on the conductive layer in the vertical trench; and
   forming an insulated gate electrode on the closed cavity in the vertical trench,
   wherein an interface between the field dielectric layer and the surrounding semiconductor body is under tensile stress and the closed cavity is filled or unfilled so as to counteract the tensile stress.

2. The method of claim 1, wherein depositing the conductive layer comprises depositing poly-silicon.

3. The method of claim 1, wherein the conductive layer is conformally deposited.

4. The method of claim 1, wherein forming the closed cavity comprises:
   filling the vertical trench with a filler material selectively etchable with respect to the conductive layer and the field dielectric layer.

5. The method of claim 1, wherein forming the closed cavity comprises:
   back-etching a filler material in the vertical trench and the conductive layer.

6. The method of claim 1, wherein forming the closed cavity comprises:
   back-etching the field dielectric layer.

7. The method of claim 1, wherein forming the closed cavity comprises:
   depositing a further conductive layer on and comprised of the same material as the conductive layer.

8. The method of claim 1, wherein forming the closed cavity comprises:
   forming an open cavity in the conductive layer.

9. The method of claim 1, wherein forming the closed cavity comprises:
   forming an open cavity in a dielectric layer.

10. The method of claim 1, wherein forming the closed cavity comprises:
    closing the open cavity by at least one of depositing a further conductive layer on the open cavity, depositing a BPSG-layer from the first surface and thermal oxidizing.

11. The method of claim 1, wherein the closed cavity is formed such that the cavity has a horizontal extension larger than about 20 nm and a vertical extension larger than the horizontal extension.

12. A method for producing a field-effect semiconductor device, comprising:
    providing a semiconductor wafer with a first surface defining a vertical direction;
    defining an active area of the field-effect semiconductor device;

forming in the active area at least one trench gate electrode and a gate dielectric region, the gate dielectric region insulating the trench gate electrode from the semiconductor wafer;

forming in the active area dielectric regions extending from the first surface vertically deeper into the semiconductor wafer than the gate dielectric region; and forming a vertical trench extending from the first surface vertically deeper into the semiconductor wafer than the gate dielectric region to form an expansion joint, wherein the at least one trench gate electrode and the gate dielectric region are formed in a first trench that vertically extends from the first surface into the semiconductor wafer, and wherein the dielectric regions and the expansion joint are formed in a second trench that is laterally separated from the first trench and extends from the first surface into the semiconductor wafer.

13. The method of claim 12, further comprising:
filling the vertical trench with an elastic material.

14. The method of claim 12, further comprising:
forming a dielectric plug on the vertical trench to form a closed cavity.

15. The method of claim 12, wherein forming the dielectric regions and forming the vertical trench comprise at least one of the following common steps:

etching wide vertical trenches from the first surface into the semiconductor wafer; and insulating side walls of the wide vertical trenches to form dielectric regions in the active area and a placeholder of the vertical trench.

16. A method for producing a field-effect semiconductor device, the method comprising:

providing a semiconductor body with a first surface defining a vertical direction;

defining an active area;

forming a vertical trench from the first surface into the semiconductor body;

forming a field dielectric layer at least on a side wall and a bottom wall of the vertical trench;

depositing a conductive layer on the field dielectric layer;

forming a closed cavity on the conductive layer in the vertical trench; and forming an insulated gate electrode on the closed cavity in the vertical trench, wherein forming the closed cavity comprises:
isotropic back-etching a filler material in the vertical trench selectively with respect to the conductive layer and the field dielectric layer.

* * * * *